(12) United States Patent
Palm et al.

(10) Patent No.: US 11,978,693 B2
(45) Date of Patent: May 7, 2024

(54) SEMICONDUCTOR DEVICE PACKAGE COMPRISING SIDE WALLS CONNECTED WITH CONTACT PADS OF A SEMICONDUCTOR DIE

(71) Applicant: Infineon Technologies AG, Neubiberg (DE)

(72) Inventors: Petteri Palm, Regensburg (DE); Ulrich Froehler, Nersingen (DE); Ralf Otremba, Kaufbeuren (DE); Andreas Riegler, Lichtpold (AT)

(73) Assignee: Infineon Technologies AG, Neubiberg (DE)

( * ) Notice: Subject to any disclaimer, the term of this patent is extended or adjusted under 35 U.S.C. 154(b) by 126 days.

(21) Appl. No.: 17/388,248

(22) Filed: Jul. 29, 2021

(65) Prior Publication Data
US 2022/0037240 A1    Feb. 3, 2022

(30) Foreign Application Priority Data
Jul. 30, 2020  (DE) .......................... 102020120139.7

(51) Int. Cl.
| H01L 23/495 | (2006.01) |
| H01L 21/56 | (2006.01) |
| H01L 21/60 | (2006.01) |
| H01L 23/31 | (2006.01) |
| H05K 1/18 | (2006.01) |

(52) U.S. Cl.
CPC ........ H01L 23/49565 (2013.01); H01L 21/56 (2013.01); H01L 21/60 (2021.08); H01L 23/3107 (2013.01); H05K 1/182 (2013.01)

(58) Field of Classification Search
CPC ... H01L 23/49565; H01L 21/56; H01L 21/60; H01L 23/3107
USPC ......................................................... 257/666
See application file for complete search history.

(56) References Cited

U.S. PATENT DOCUMENTS

| 4,829,403 A | 5/1989 | Harding |
| 5,365,107 A | 11/1994 | Kuraishi et al. |
| 5,703,398 A | 12/1997 | Sono et al. |
| 9,953,913 B1 | 4/2018 | Gowda et al. |
| 2007/0236891 A1 | 10/2007 | Mamitsu |

(Continued)

FOREIGN PATENT DOCUMENTS

CN       108039341 A    5/2018

*Primary Examiner* — Caleb E Henry
*Assistant Examiner* — Dilinh P Nguyen
(74) *Attorney, Agent, or Firm* — Murphy, Bilak & Homiller, PLLC

(57) ABSTRACT

A semiconductor device package includes a printed circuit board including a first central area, a second lateral area, and a third lateral area, a semiconductor die including a first main face and a second main face opposite the first main face, a first contact pad on the first main face and a second contact pad on the second main face, the semiconductor die disposed in the first central area of the printed circuit board, a first metallic side wall of the semiconductor device package disposed in the second lateral area of the printed circuit board, a second metallic side wall of the semiconductor device package disposed in the third lateral area of the printed circuit board, wherein at least one of the first metallic side wall and the second metallic side wall is electrically connected with one of the first contact pad or the second contact pad.

12 Claims, 23 Drawing Sheets

(56) References Cited

U.S. PATENT DOCUMENTS

| | | |
|---|---|---|
| 2013/0256856 A1 | 10/2013 | Mahler et al. |
| 2016/0225684 A1 | 8/2016 | Li et al. |
| 2018/0269146 A1* | 9/2018 | Palm .................... H01L 21/568 |
| 2019/0148279 A1 | 5/2019 | Kapusta et al. |

* cited by examiner

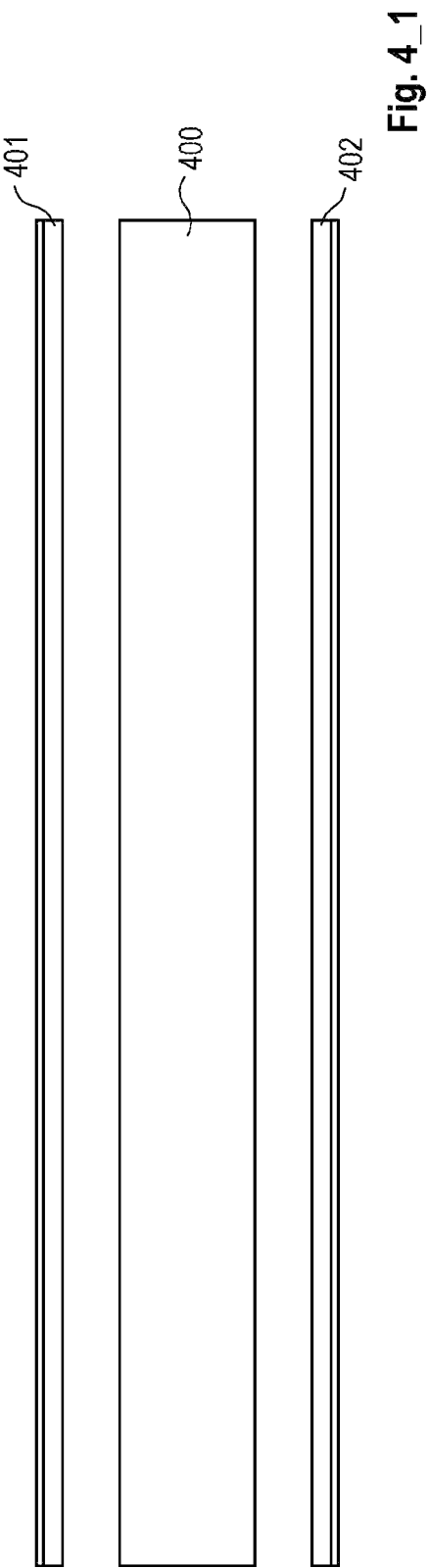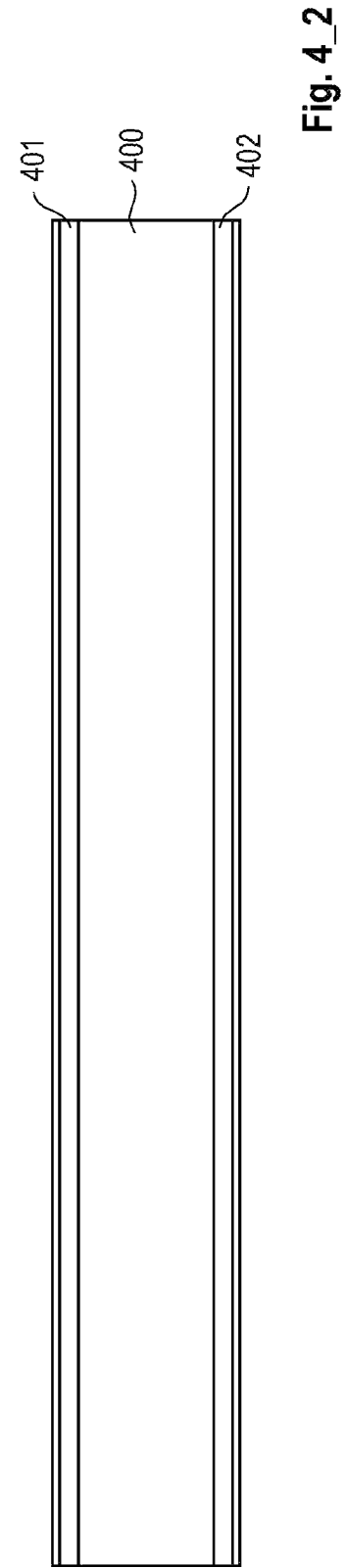

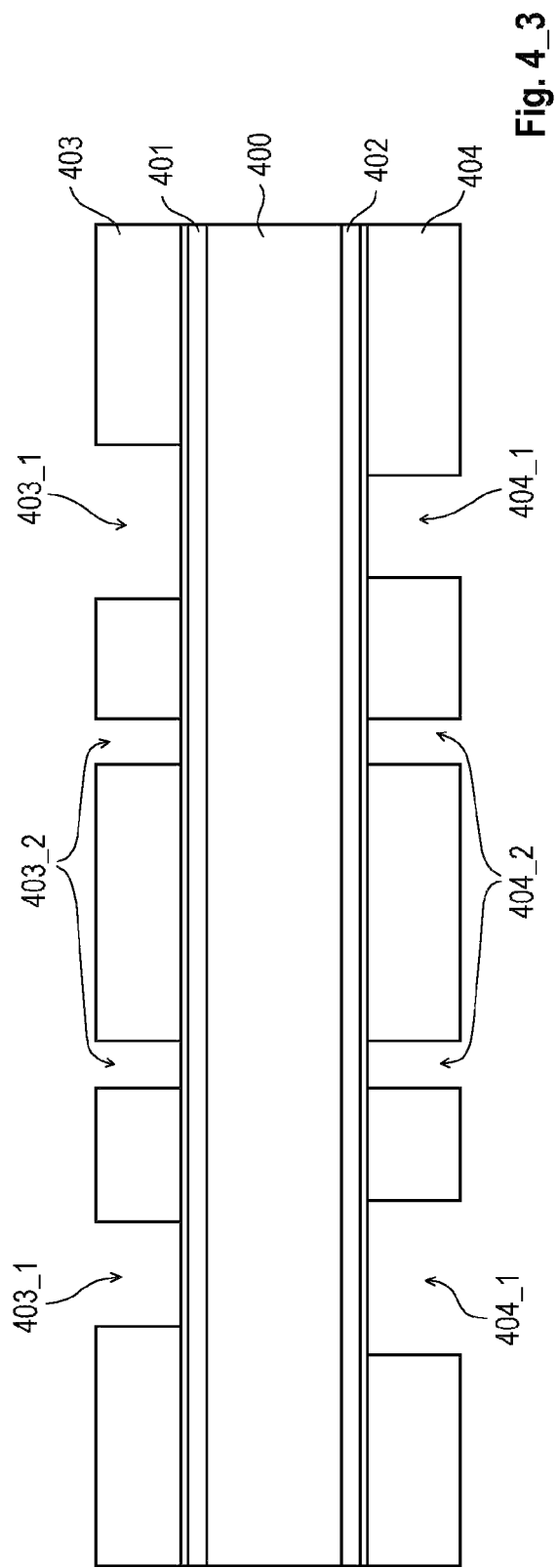
Fig. 4_3
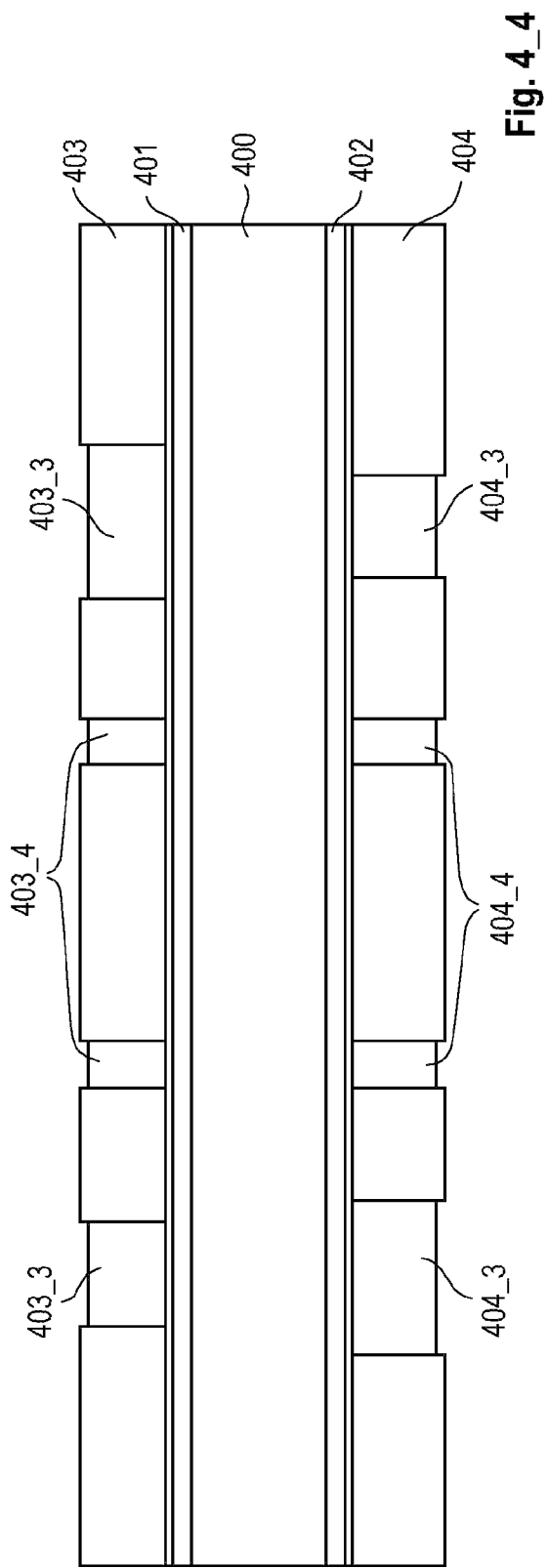
Fig. 4_4

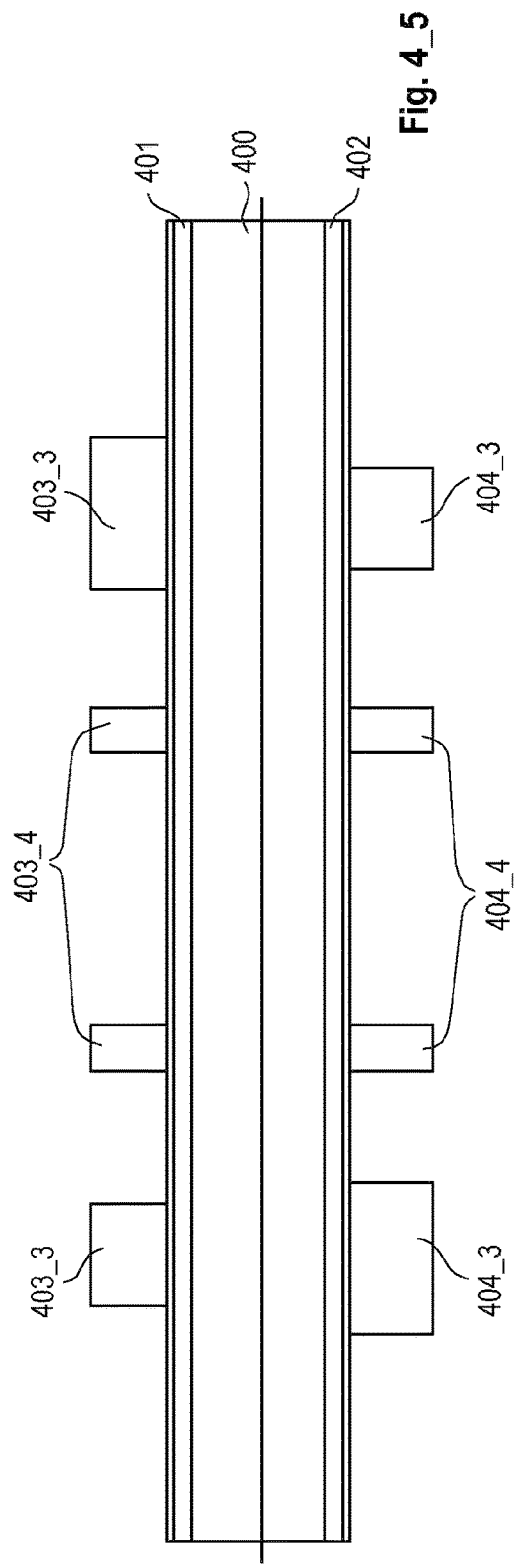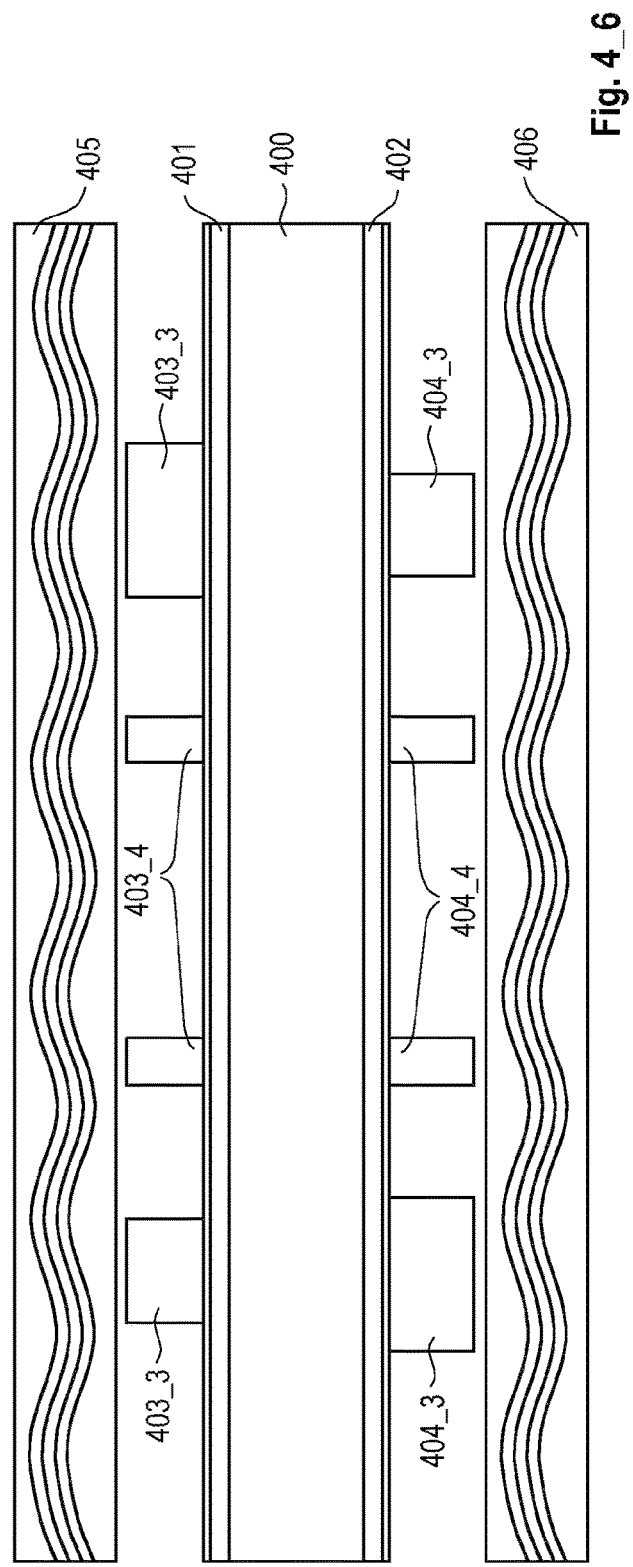

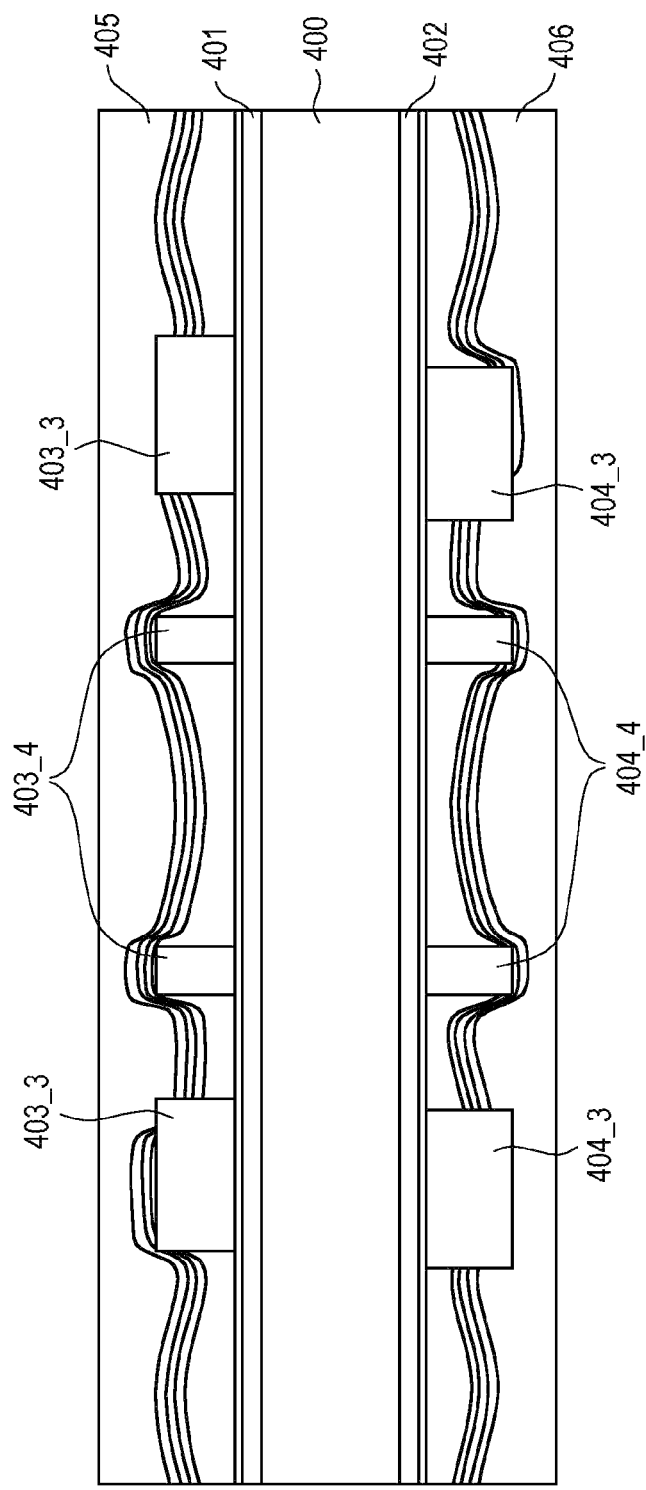
Fig. 4_7

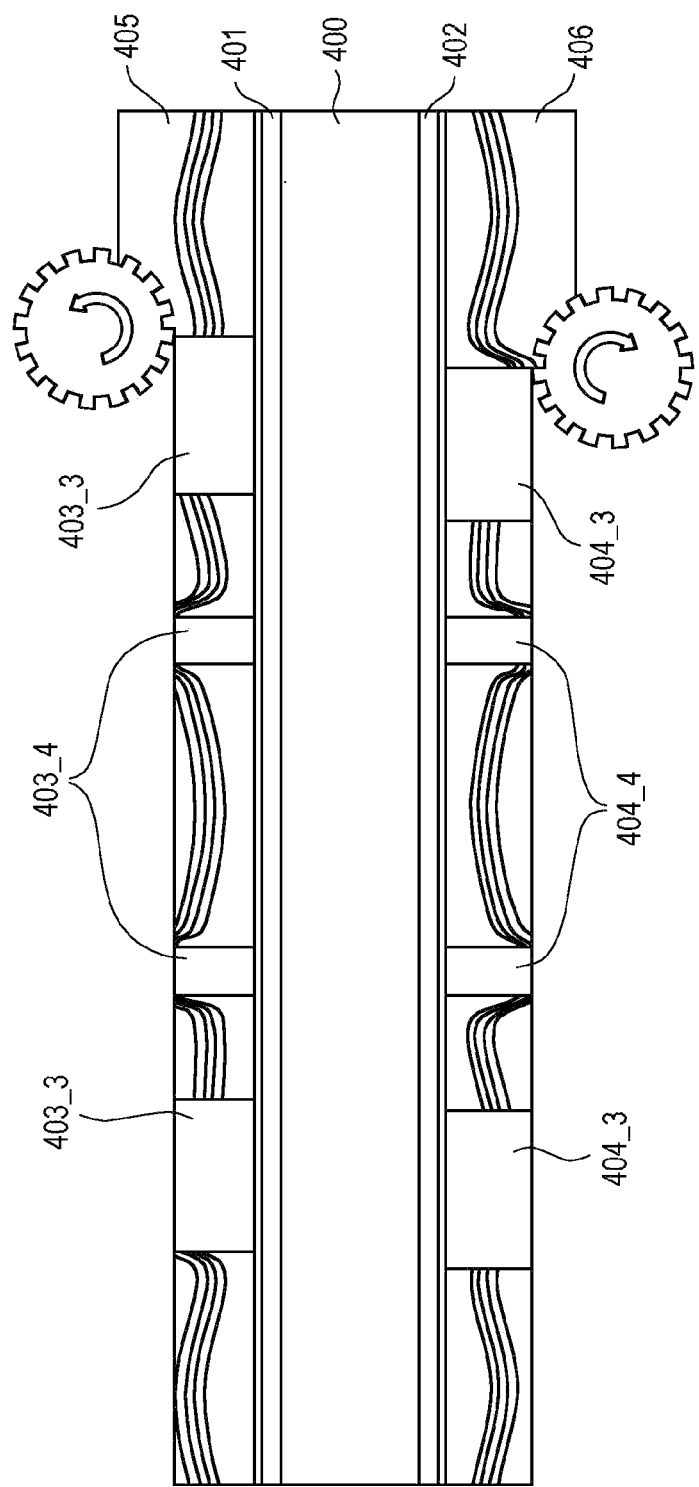
Fig. 4_8

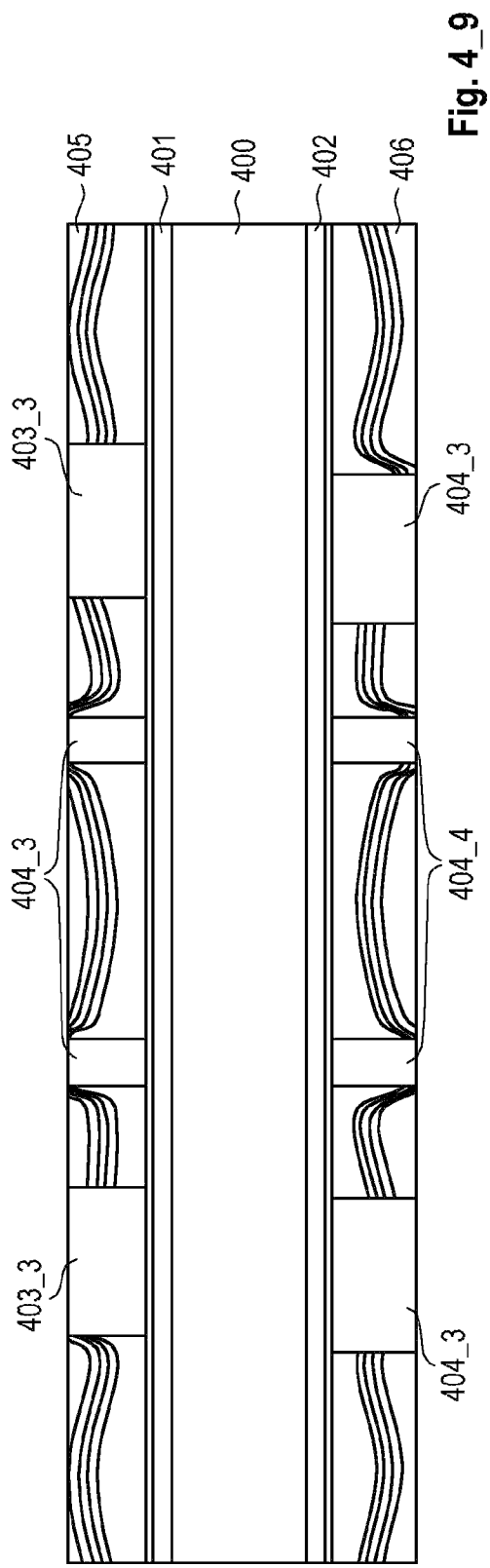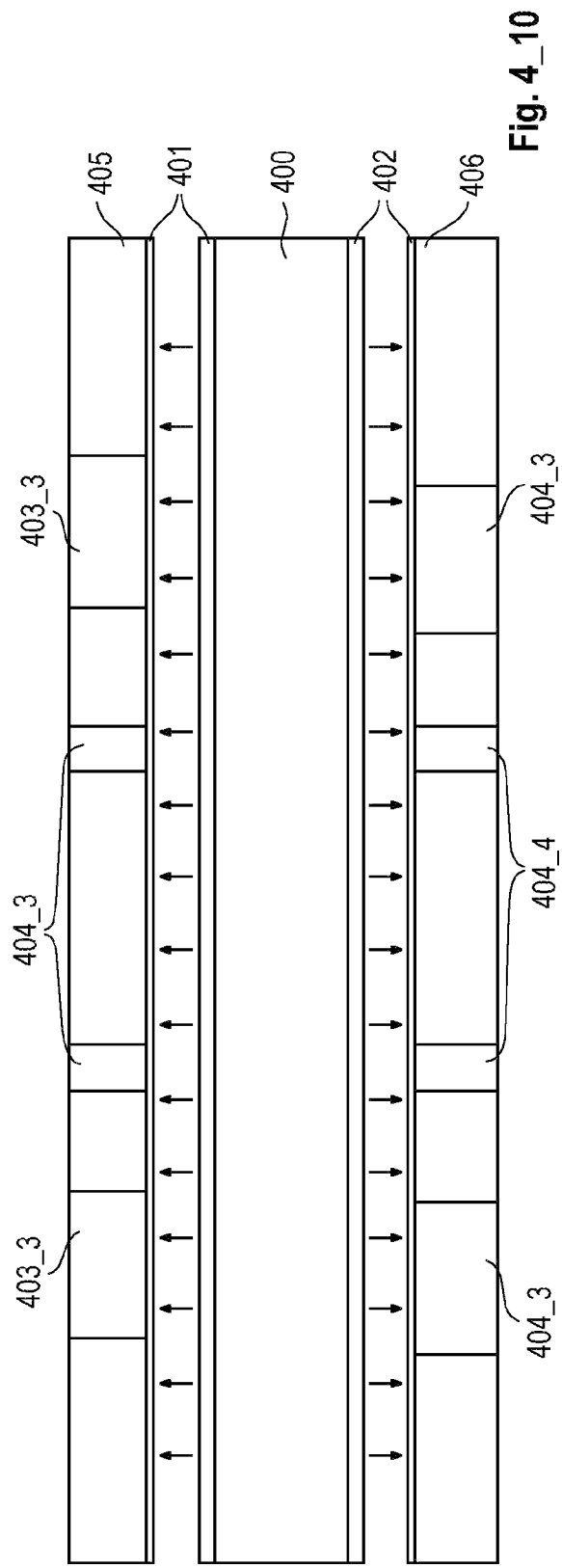

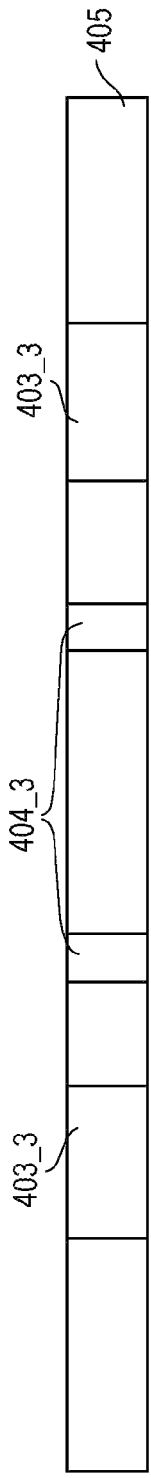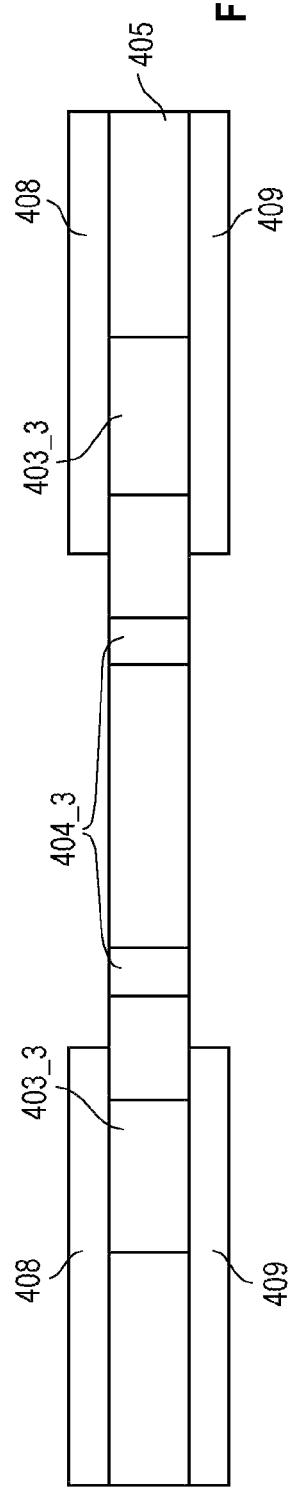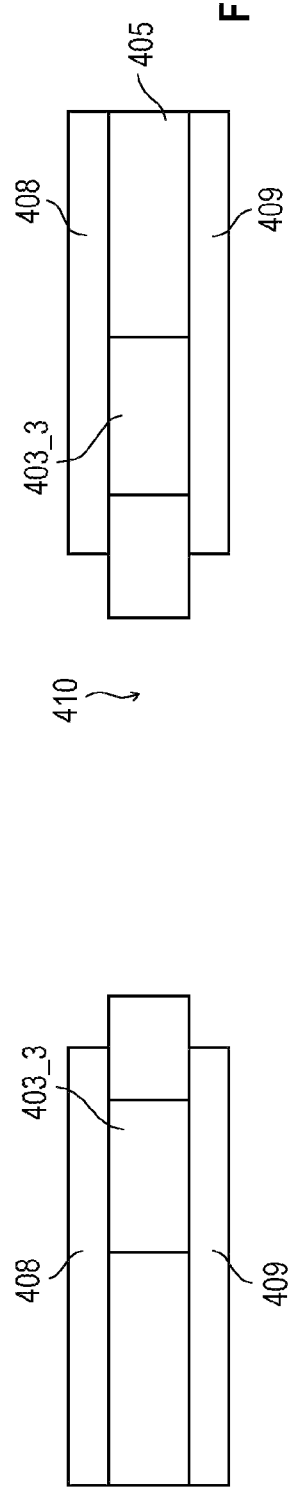

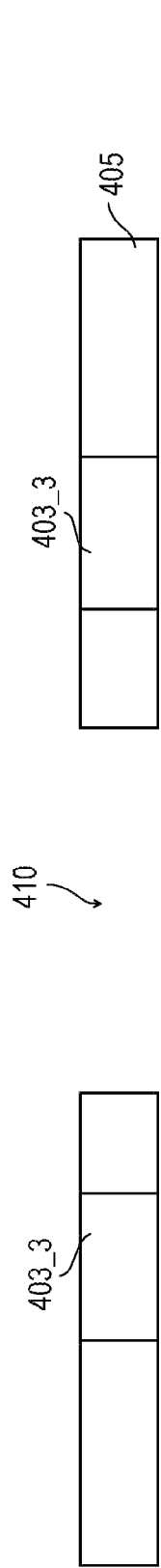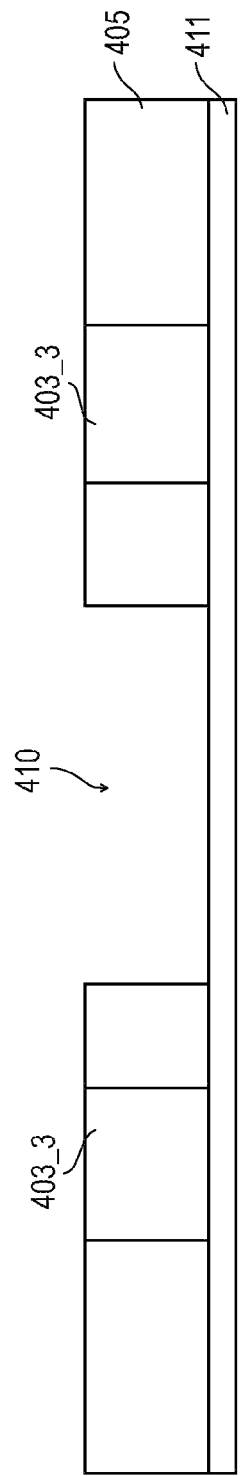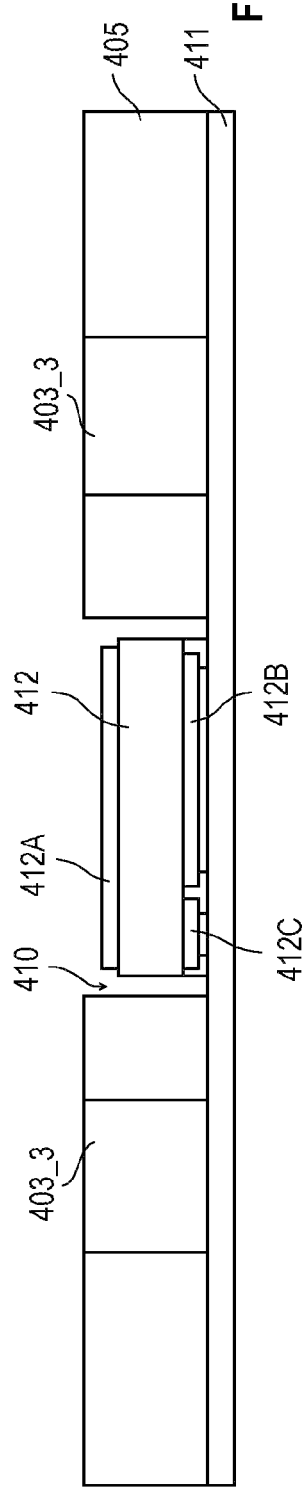

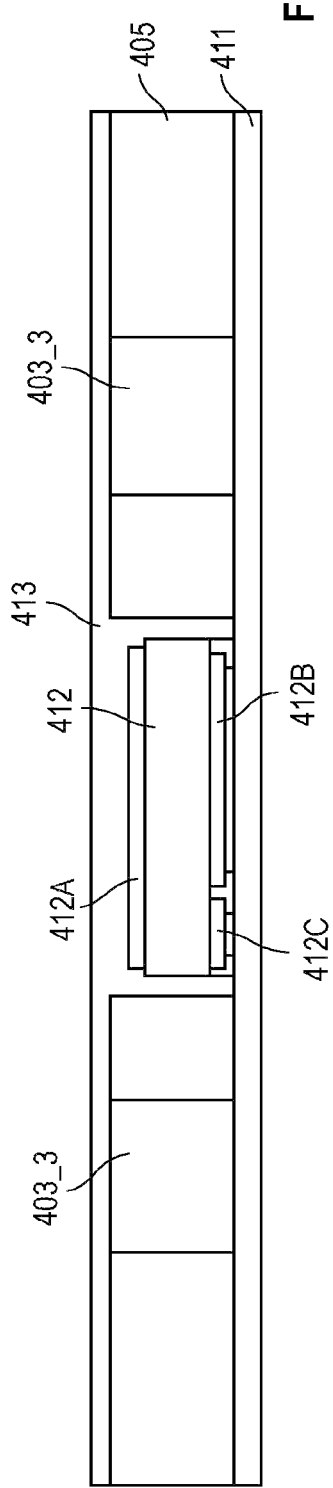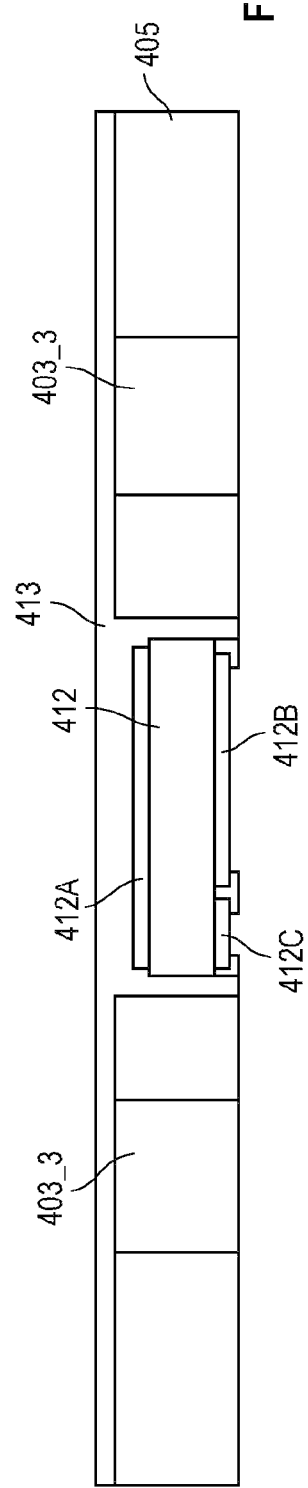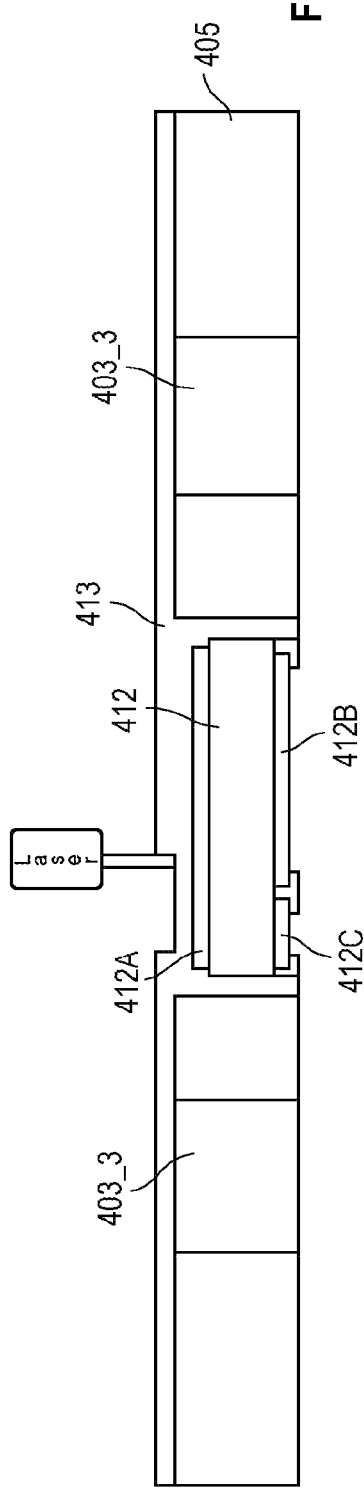

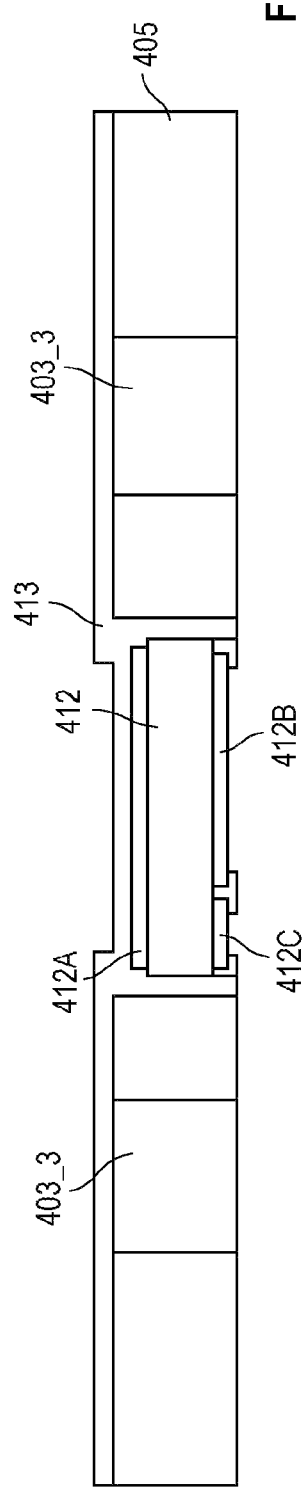# Fig. 4_20
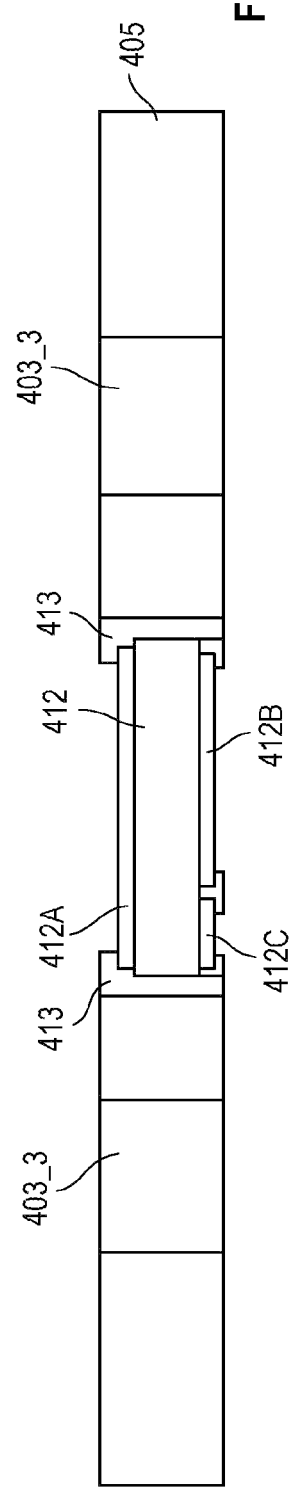# Fig. 4_21
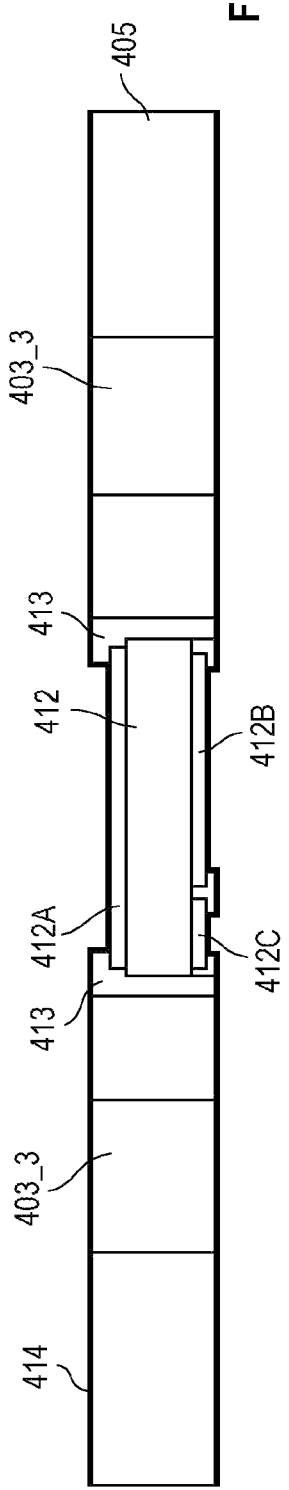# Fig. 4_22

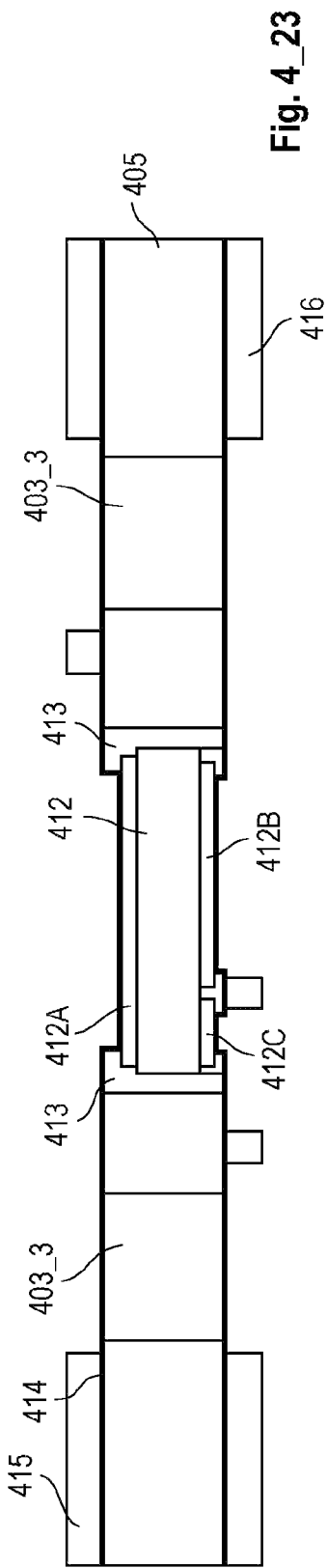
Fig. 4_23
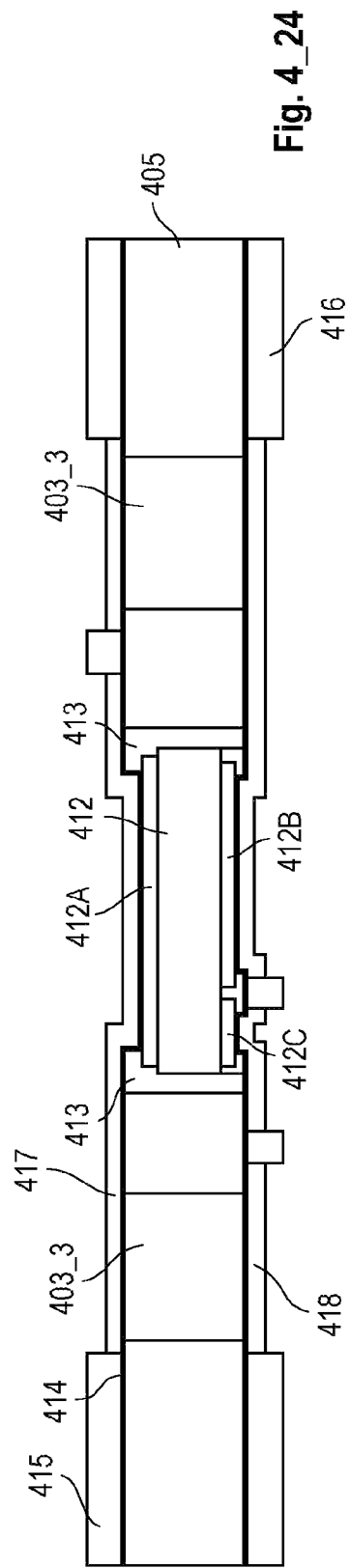
Fig. 4_24

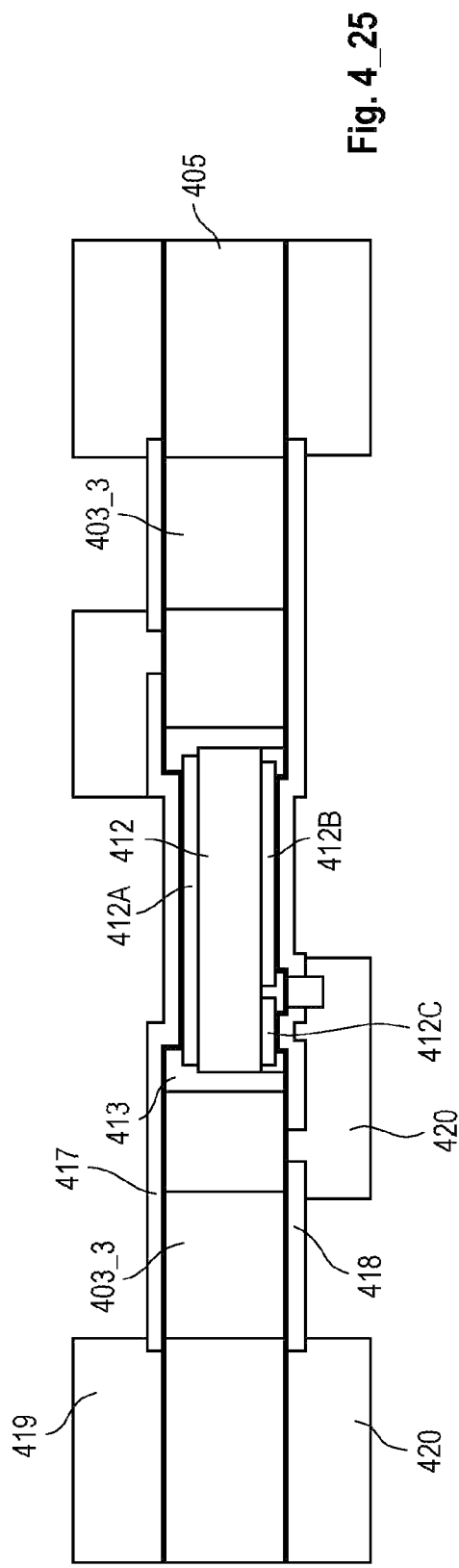
Fig. 4_25
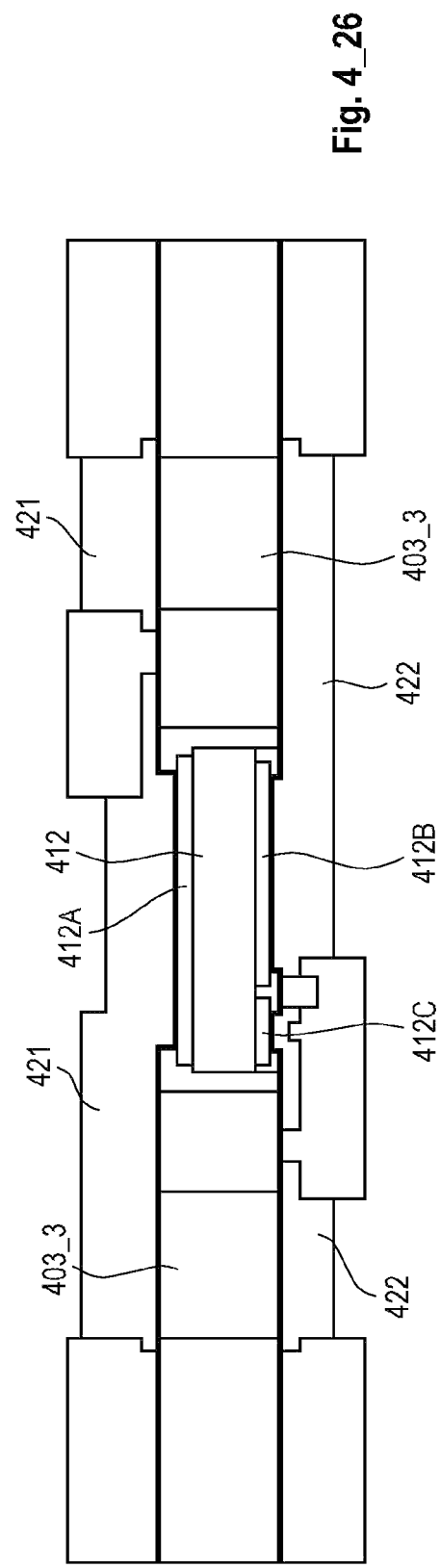
Fig. 4_26

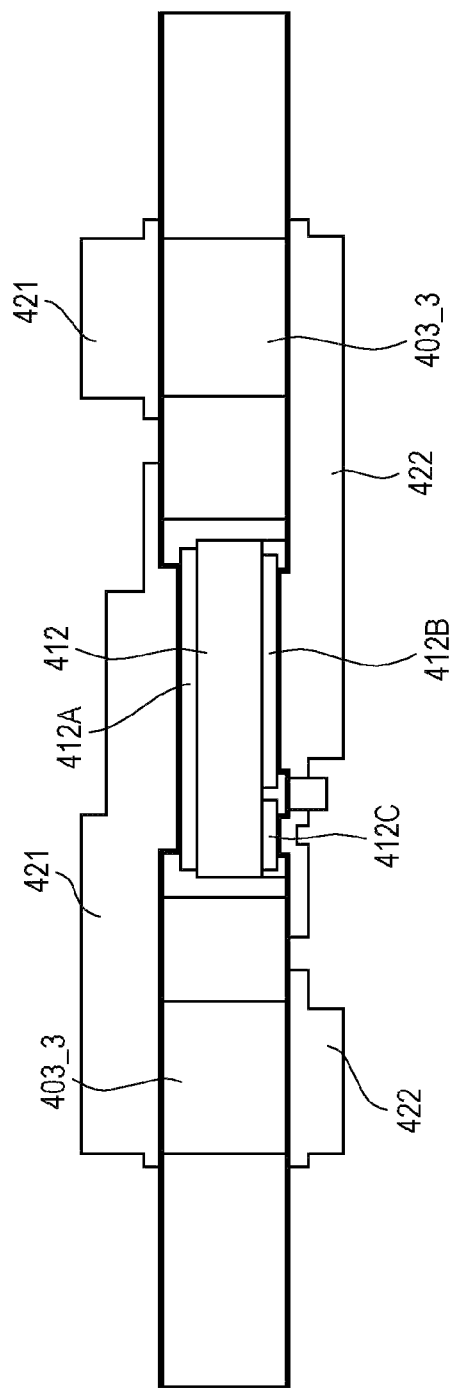

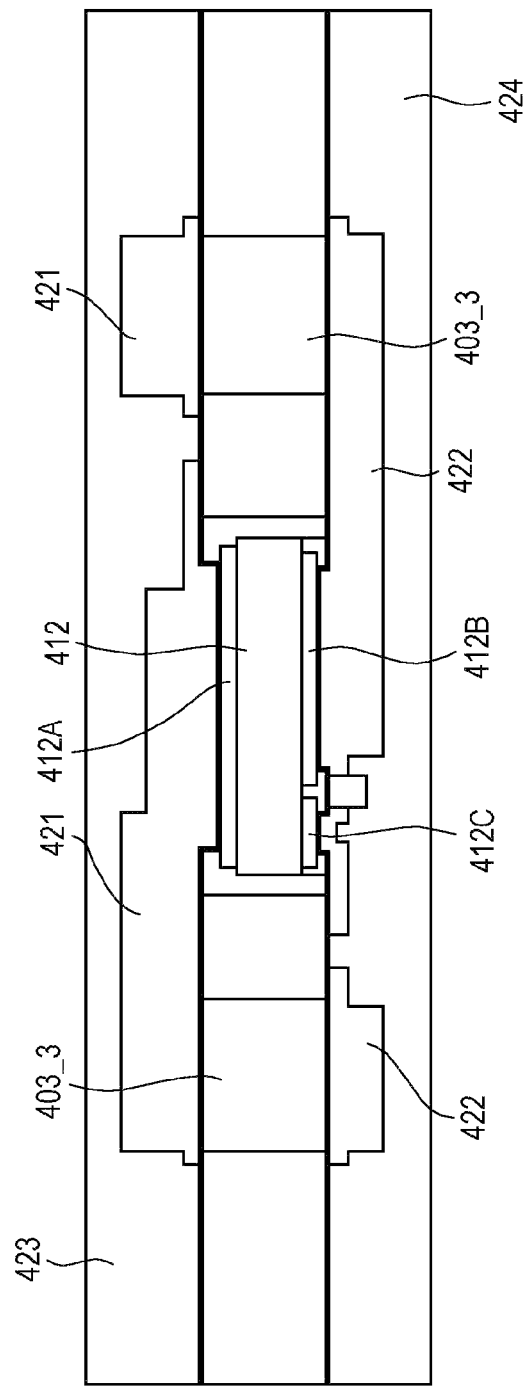
Fig. 4_28

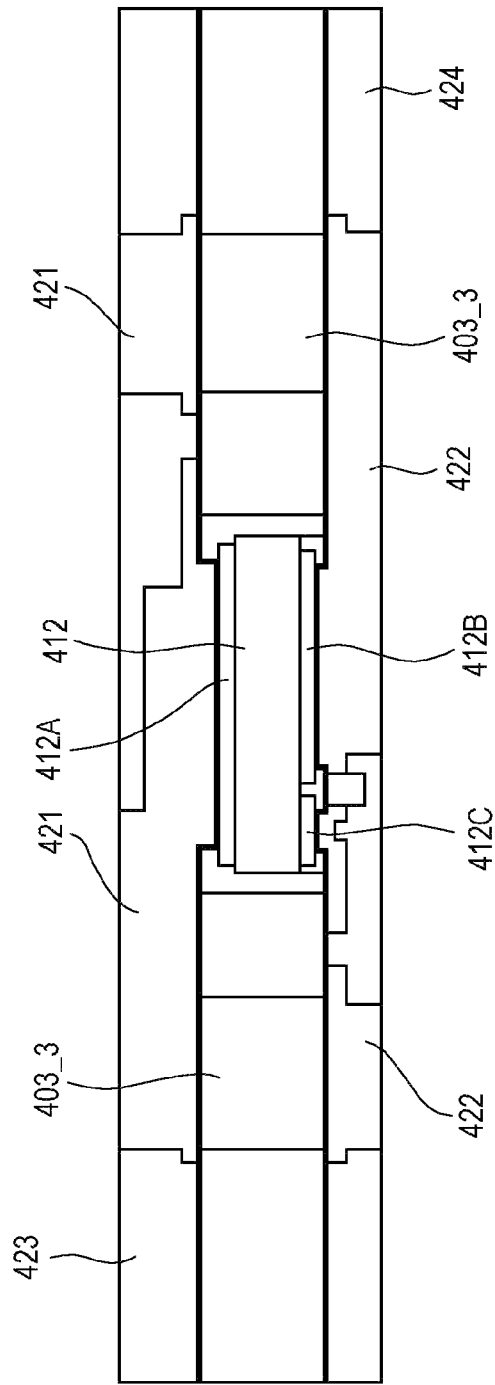
Fig. 4_29

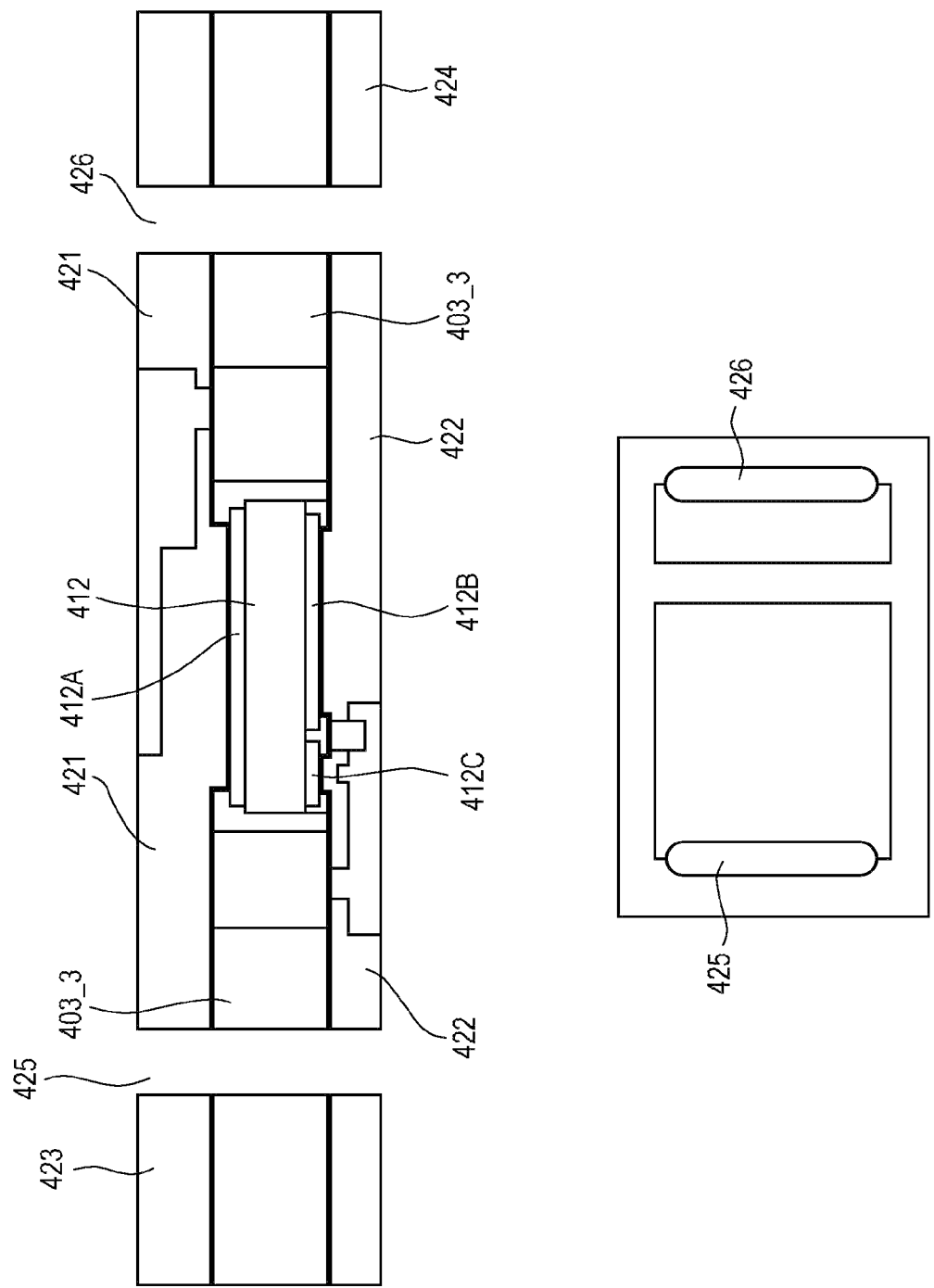
Fig. 4_30

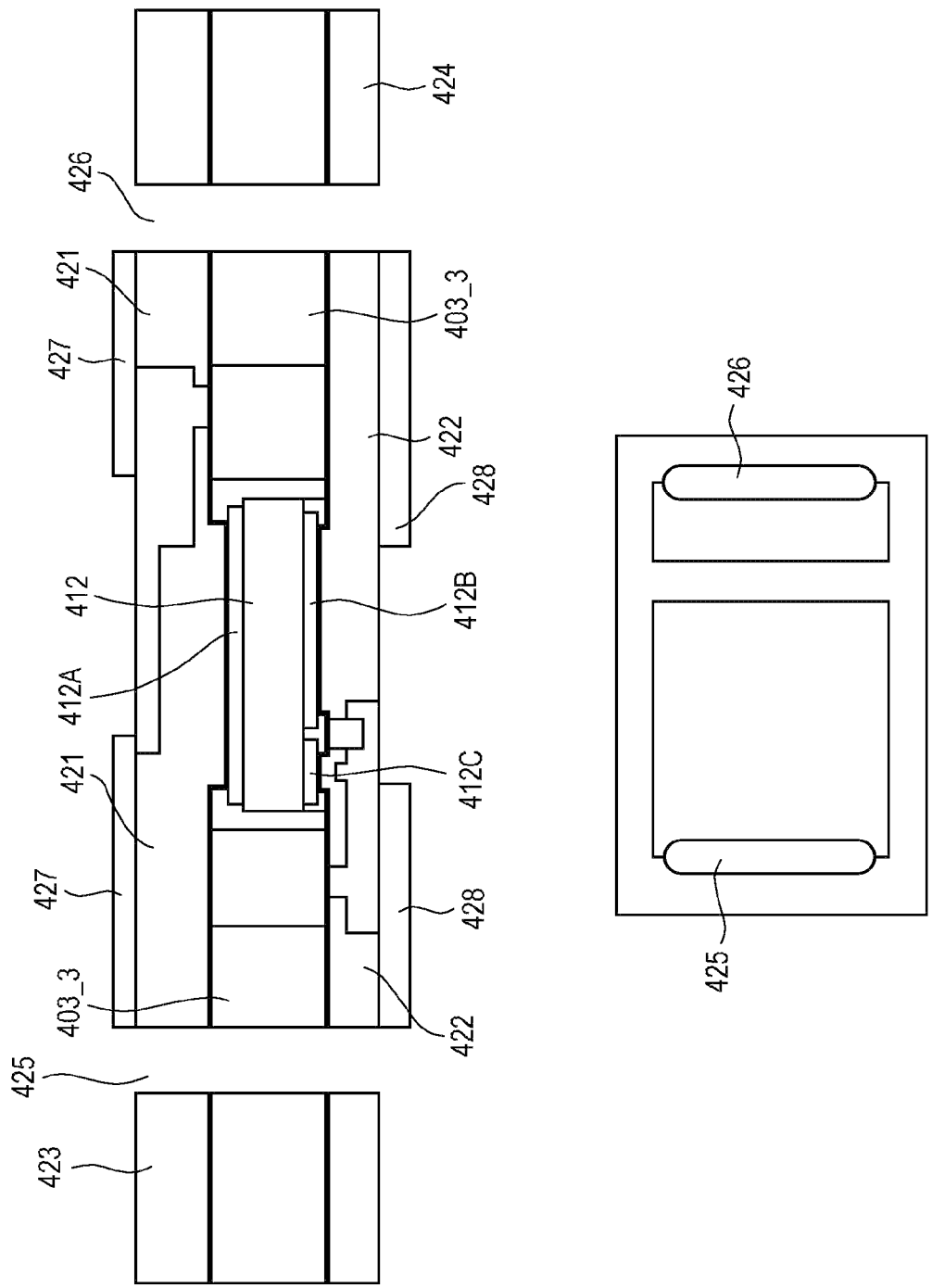
Fig. 4_31

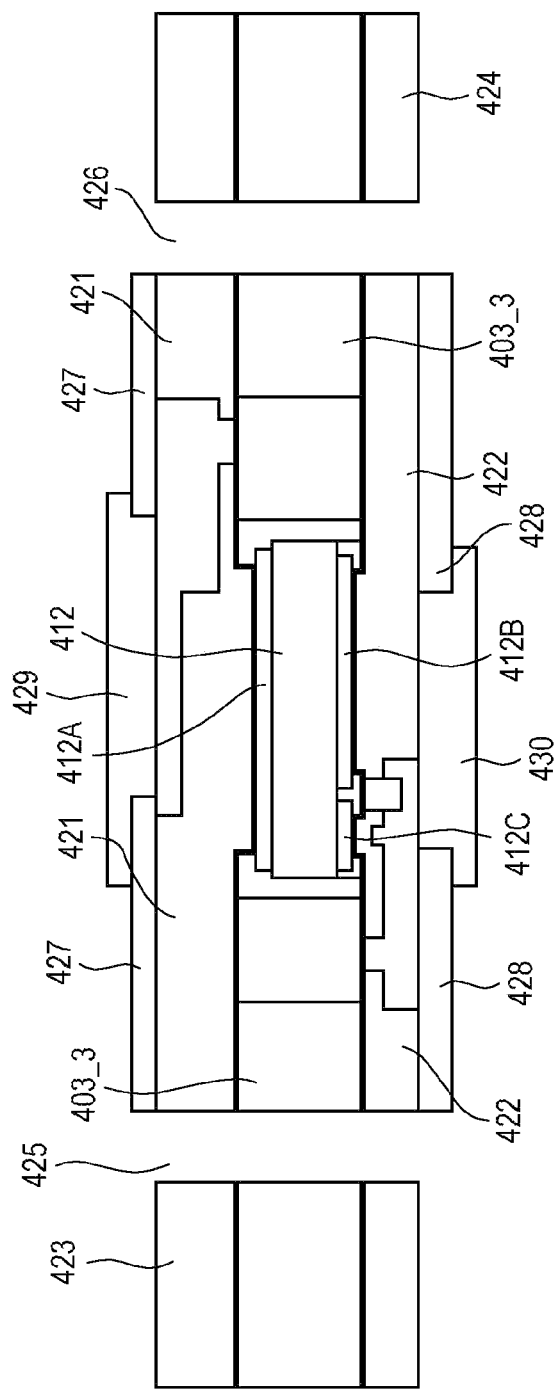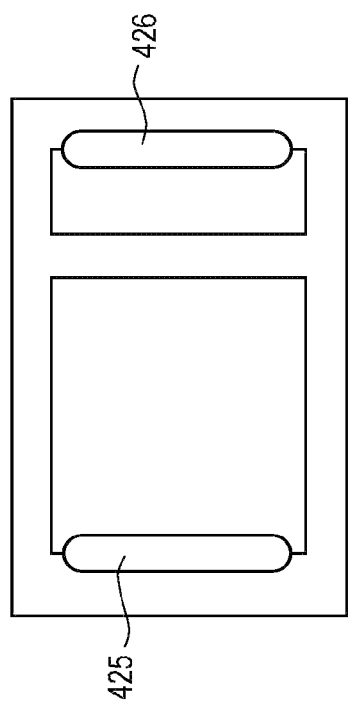
Fig. 4_32

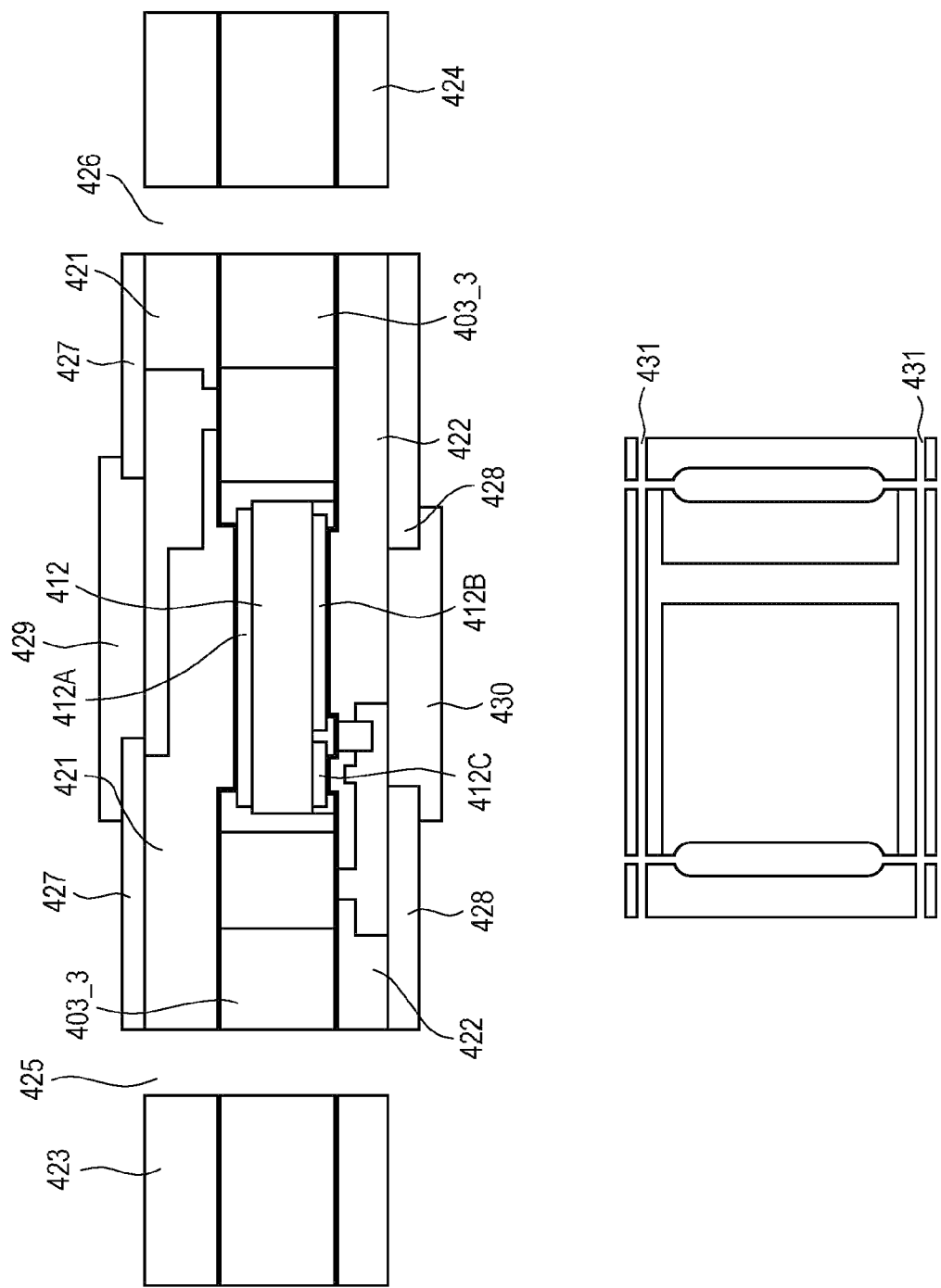

SEMICONDUCTOR DEVICE PACKAGE COMPRISING SIDE WALLS CONNECTED WITH CONTACT PADS OF A SEMICONDUCTOR DIE

TECHNICAL FIELD

The present disclosure relates to a semiconductor device package and a method for fabricating a semiconductor device package.

BACKGROUND

Chip embedding is a solution where an active or passive component is positioned in between at least two layers of a printed circuit board. Today it is commonly used for low voltage signal processing systems, there are first attempts to apply embedding for power circuits with low voltages <100V, but for high voltages special challenges are to be expected in connection with the high electric fields. The motivations for doing that are manifold, e.g. increasing power density, extreme low parasitic inductances, better EMI shielding, and also high reliability and high power cycling robustness. Also chip embedding usually employs chemically plated, in particular electroplated, electrical interconnects, which are superior over other types of electrical interconnects.

Another solution for manufacturing a chip embedded high voltage semiconductor device is to place the die on a leadframe, singulate the dies on leadframe and embed this assembly afterwards. One risk of the embedding technology is the interaction of the devices with the used carrier material where one dominant mechanism among other things is the voltage and the resulting electric field. This can lead in worst case to a destruction of the assembly caused by e.g. copper migration. Another threat is the exposed copper metallization on the die. Oxidation of this metallization must be treated special in the embedding process. After the placement of the component, the connection to the outer layers is done through vias. Especially the passage from the via to the die metallization is a critical point for cracks. In addition there is a strong interaction of the embedding encapsulation material and the fabrication process in combination with high voltage devices and resulting electric field, causing chemical degradation of encapsulation material (e.g. pentode, reversible drifts), voltage drift of the device by ions from encapsulation material, corrosion of the device. Embedding material is also sensible to humidity and cannot guarantee density to the covered chips which accelerates the negative effects just described. To prevent delamination of the surrounding layers cavities in the leadframe are used, where the die is placed afterwards. Following this approach for each die a dedicated cavity must be done.

For these and other reasons there is a need for the present disclosure.

SUMMARY

A first aspect of the present disclosure is related to A semiconductor device package, comprising a printed circuit board comprising a first central area, a second lateral area, and a third lateral area, a semiconductor die comprising a first main face and a second main face opposite to the first main face, a first contact pad disposed on the first main face and a second contact pad disposed on the second main face, the semiconductor die being disposed in the first central area of the printed circuit board, a first metallic side wall of the semiconductor device package disposed in the second lateral area of the printed circuit board, a second metallic side wall of the semiconductor device package disposed in the third lateral area of the printed circuit board, wherein at least one of the first metallic side wall and the second metallic side wall is electrically connected with one of the first contact pad or the second contact pad of the semiconductor die.

A second aspect of the present disclosure is related to a method for fabricating a semiconductor device package, the method comprising providing a printed circuit board comprising a first central area, a second lateral area, and a third lateral area, wherein a semiconductor die comprising contact pads is disposed in the first central area, a first metallic side wall is disposed in the second lateral area, and a second metallic side wall is disposed in the third lateral area, electrically connecting at least one of the first and second metallic side walls with one of the contact pads of the semiconductor die, and finishing the semiconductor device package so that the first and second metallic side walls are exposed to the outside and defining a respective side wall of the semiconductor device package.

A third aspect of the present disclosure is related to a semiconductor device package, comprising a printed circuit board comprising a first central area, a semiconductor die comprising a first main face and a second main face opposite to the first main face, a first contact pad disposed on the first main face and a second contact pad disposed on the second main face, the semiconductor die being disposed in the first central area of the printed circuit board, a first metallic via bar disposed on the first contact pad of the semiconductor die, the first metallic via bar comprising a thickness of at least 100 µm, and a second metallic via bar disposed on the second contact pad of the semiconductor die, the second metallic via bar comprising a thickness of at least 100 µm.

A forth aspect of the present disclosure is related to a method for fabricating a semiconductor device package, the method comprising providing a printed circuit board comprising a first central opening, wherein a semiconductor die is disposed in the first central opening, the semiconductor die comprising a first main face and a second main face opposite to the first main face and a first contact pad disposed on the first main face and a second contact pad disposed on the second main face, disposing a first metallic via bar on the first contact pad of the semiconductor die, the first metallic via bar comprising a thickness of at least 100 µm, and disposing a second metallic via bar on the second contact pad of the semiconductor die, the second metallic via bar comprising a thickness of at least 100 µm.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

FIG. 4 comprises FIGS. 4_1 to 4_33 and shows schematic cross-sectional side view representations for illustrating a method for fabricating a semiconductor device package such as that shown in FIG. 1.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Figure 1:
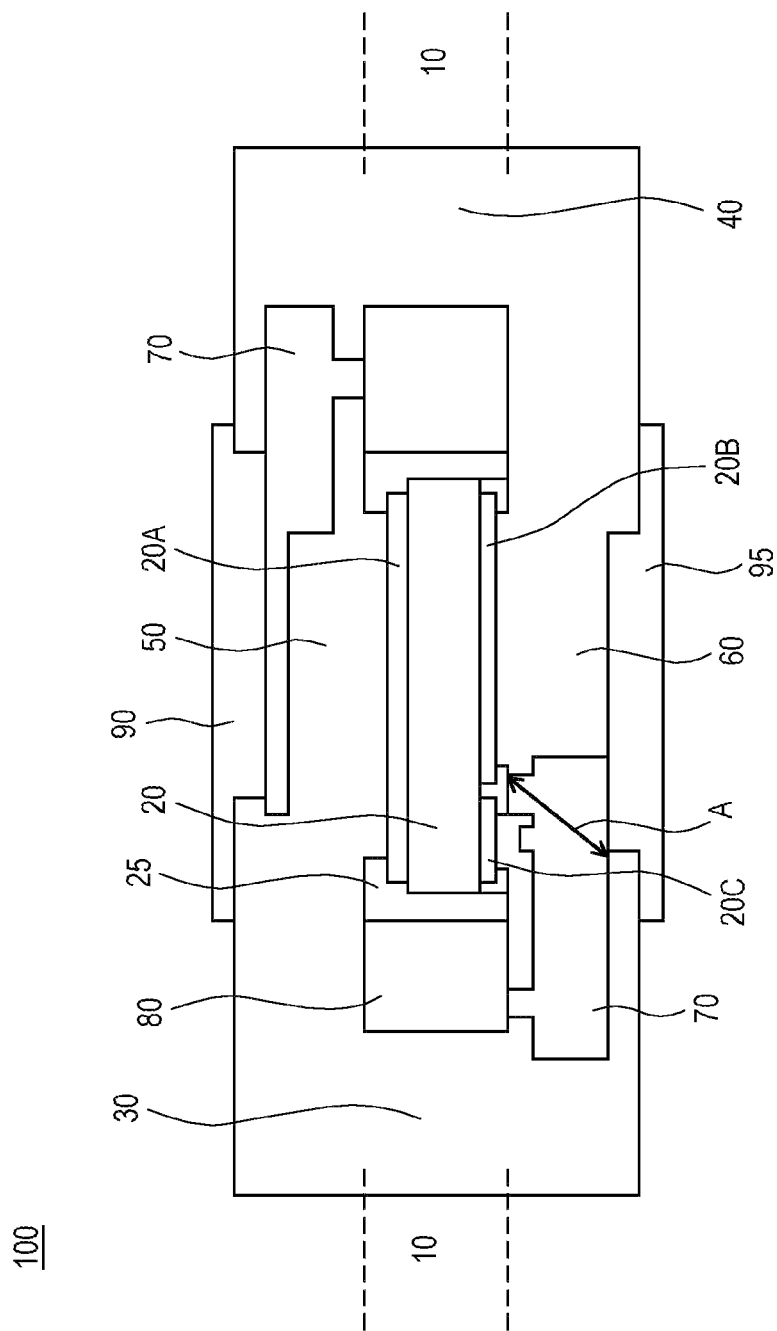
FIG. 1 shows a schematic cross-sectional side view representation of a semiconductor device package according to an example, in which the semiconductor device package comprises metallic side walls as well as via bars on the contact pads of the semiconductor die.

FIG. 1 shows a schematic cross-sectional side view representation of a semiconductor device package. The semiconductor device package 100 comprises a printed circuit board 10 comprising a first central area, a semiconductor die 20 comprising a first main face and a second main face opposite to the first main face, a first contact pad 20A disposed on the first main face and a second contact pad 20B disposed on the second main face, the semiconductor die 20 being disposed in the first central area of the printed circuit board 10.

The printed circuit board 10 is part of a core layer whereas a layer above the core layer can be called a top build-up layer, and a layer below the core layer can be called a bottom build-up layer.

The semiconductor device package 100 of FIG. 1 may further comprise a second lateral area and a third lateral area, a first metallic side wall 30 of the semiconductor device package disposed in the second lateral area of the printed circuit board 10, and a second metallic side wall 40 of the semiconductor device package disposed in the third lateral area of the printed circuit board 10, wherein one or both of the first metallic side wall 30 and the second metallic side wall 40 is electrically connected with one of the first contact pad 20A or the second contact pad 20B of the semiconductor die 20. Such a semiconductor device package represents a semiconductor device package according to the first aspect of the present disclosure.

The semiconductor device package 100 of FIG. 1 may alternatively or in addition comprise a first metallic via bar 50 disposed on the first contact pad 20A of the semiconductor die 20, the first metallic via bar 50 comprising a thickness of at least 100 µm, and a second metallic via bar 60 disposed on the second contact pad 20B of the semiconductor die 20, the second metallic via bar 60 comprising a thickness of at least 100 µm. Such a semiconductor device package represents a semiconductor device package according to the second aspect of the present disclosure.

The thickness of one or both of the first and second metallic via bars 50 and 60 can be in a range from 100 µm to 250 µm, whereas the lower bound can be 110 µm, 120 µm, 130 µm, 140 µm, or 150 µm, and the upper bound can be 240 µm, 230 µm, 220 µm, 210 µm, or 200 µm.

In other words, FIG. 1 shows a semiconductor device package 100 in which essential features of the semiconductor device packages of the first and second aspects of the present disclosure are shown together.

In the semiconductor device package 100 as shown in FIG. 1, the first metallic side wall 30 is electrically connected to the first contact pad 20A of the semiconductor die 20, and the second metallic side wall 40 is electrically connected to the second contact pad 20B of the semiconductor die 20. However, it is also possible that only one of the first metallic side wall 30 and the second metallic side wall 40 is electrically connected to the first contact pad 20A or the second contact pad 20B of the semiconductor die 20, respectively.

According to an example the semiconductor device package 100 the first metallic via bar 50 is connected between the first contact pad 20A of the semiconductor die 20 and the first metallic side wall 30, and the second metallic via bar 60 is connected between the second contact pad 20B of the semiconductor die 20 and the second metallic side wall 40.

According to an example the semiconductor device package 100 further comprises a first upper main face of the semiconductor device package and a second lower main face of the semiconductor device package, wherein at least one of the first metallic side wall 30 and the second metallic side wall 40 is exposed at the first upper main face and/or at the second lower main face of the semiconductor device package 100. According to an example thereof, the first metallic side wall 30 and the second metallic side wall 40 are exposed at the first upper main face and/or at the second lower main face of the semiconductor device package 100.

According to an example of the semiconductor device package 100, at least one of the outer vertical end faces of the first metallic side wall 30 and the second metallic side wall 40 is exposed to the outside.

A thickness of one or both of the first and second metallic side walls 30 and 40 can be in a range from 100 μm to 250 μm, whereas the lower bound can be 110 μm, 120 μm, 130 μm, 140 μm, or 150 μm, and the upper bound can be 240 μm, 230 μm, 220 μm, 210 μm, or 200 μm.

According to an example the semiconductor device package 100 further comprises an isolation distance (arrow A) between the second contact pad 20B and a metallic region connected with the first side wall 30, the isolation range being in a range between 100 μm and 300 μm, wherein the lower bound of the range can also be 110 μm, 120 μm, 130 μm, 140 μm, or 150 μm, and the upper bound of the range can also be 290 μm, 280 μm, 270 μm, 260 μm, or 250 μm.

According to an example the semiconductor device package 100 further comprises a polymer layer 70 disposed on the printed circuit board. An upper portion of the polymer layer 70 shown in FIG. 1 serves to electrically isolate the first metallic via bar 50 from the second metallic side wall 40, and a lower portion of the polymer layer 70 serves to electrically isolate the second metallic via bar 60 from the first metallic side wall 30. The polymer layer 70 can be formed by laminating as will be shown later.

According to an example of the semiconductor device package 100 of FIG. 1, the semiconductor die 20 can be embedded in a polymer film 25. The polymer film 25 is enclosed by a polymer layer 80, in particular an FR4 prepreg layer.

According to an example of the semiconductor device package 100 of FIG. 1, into the upper and lower surfaces of the semiconductor device package 100 solder resist layers 90 and 95 are formed so that they are disposed on portions of the polymer layer 70. It is thus possible to electrically connect the side walls 30 and 40 by soldering in any desired way to an external device.

Figure 2:
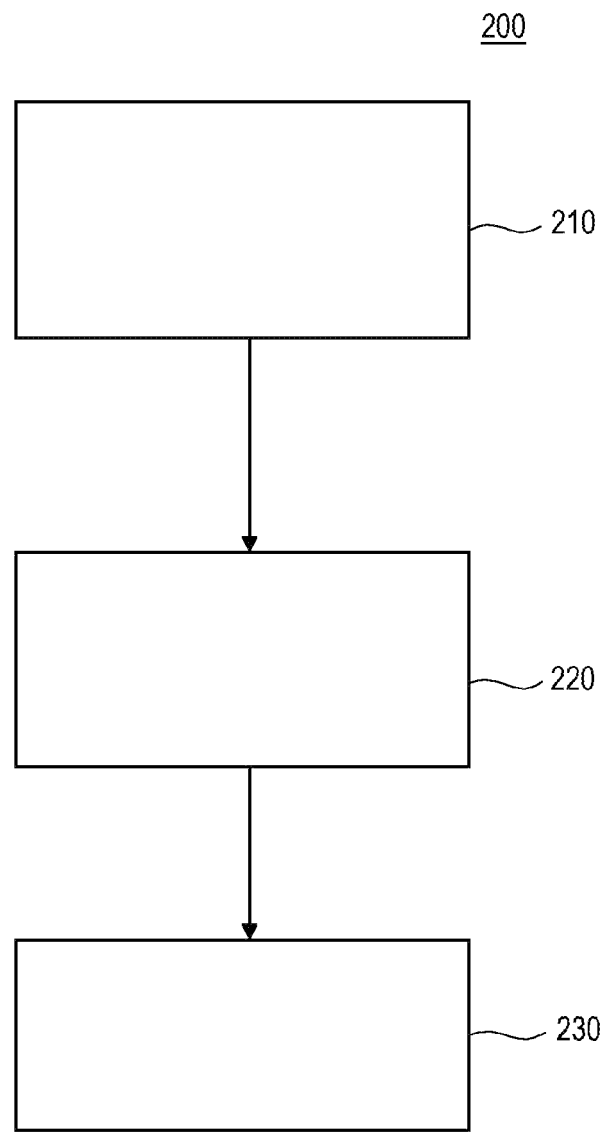
FIG. 2 shows a flow diagram of a method for fabricating a semiconductor device package according to the second aspect.

FIG. 2 shows a flow diagram of a method for fabricating a semiconductor device package according to the second aspect.

The method 200 according to FIG. 2 comprises providing a printed circuit board comprising a first central opening, a second lateral opening, and a third lateral opening, wherein a semiconductor die comprising contact pads is disposed in the first central opening, a first metallic side wall is disposed in the second lateral opening, and a second metallic side wall is disposed in the third lateral opening (210), electrically connecting at least one of the first and second metallic side walls with one of the contact pads of the semiconductor die (220), and finishing the fabrication of the semiconductor device package so that the first and second metallic side walls are exposed to the outside and defining a respective side wall of the semiconductor device package (230).

The method 200 aims in particular at fabricating a semiconductor device package according to the first aspect.

Each one of the steps 210-230 may comprise a number of sub-steps. Therefore FIG. 4 comprising FIG. 4_1-FIG. 4_33 will show in somewhat more detail how the method 200 can in fact be carried out.

According to an example of the method 200, the method further comprises electrically connecting one of the first metallic side wall and the second metallic side wall to the first contact pad of the semiconductor die, and electrically connecting the other one of the first metallic side wall and the second metallic side wall to the second contact pad of the semiconductor die. According to a further example thereof, electrically connecting is conducted such that both of the first metallic side wall and the second metallic side wall are exposed at at least one of a first upper main face and a second lower main face of the semiconductor device package.

According to an example of the method 200, the method further comprises disposing an isolation layer over at least the semiconductor die. In fact, it will be seen in FIG. 4 that the isolation layer can be disposed over more than only the semiconductor die. The isolation layer can comprise, for example, a polymer layer or a laminate layer.

According to an example of the method 200, electrically connecting comprises galvanic plating.

Figure 3:
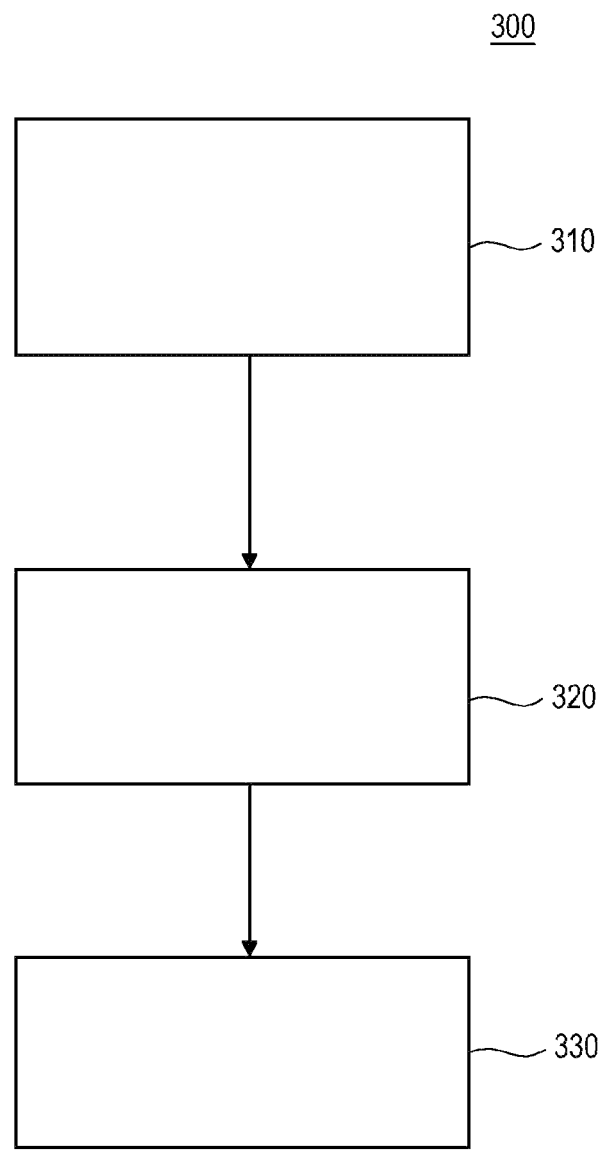
FIG. 3 shows a flow diagram of a method for fabricating a semiconductor device package according to the forth aspect.

FIG. 3 shows a flow diagram of a method for fabricating a semiconductor device package according to the forth aspect.

The method 300 according to FIG. 3 comprises providing a printed circuit board comprising a first central opening, wherein a semiconductor die is disposed in the first central opening, the semiconductor die comprising a first main face and a second main face opposite to the first main face and a first contact pad disposed on the first main face and a second contact pad disposed on the second main face (310), disposing a first metallic via bar on the first contact pad of the semiconductor die, the first metallic via bar comprising a thickness of at least 100 μm (320), and disposing a second metallic via bar on the second contact pad of the semiconductor die, the second metallic via bar comprising a thickness of at least 100 μm (330).

The method 300 aims in particular at fabricating a semiconductor device package according to the third aspect.

Each one of the steps 310-330 may comprise a number of sub-steps. Therefore FIG. 4 comprising FIG. 4_1-FIG. 4_33 will show in somewhat more detail how the method 300 can in fact be carried out.

According to an example of the method 300, the printed circuit board further comprises a second lateral opening, and a third lateral opening, wherein a first metallic side wall is disposed in the second lateral opening of the printed circuit board, and a second metallic side wall is disposed in the third lateral opening of the printed circuit board, and the method 300 further comprises electrically connecting the first metallic via bar with the first metallic side wall, and electrically connecting the second metallic via bar with the second metallic side wall.

According to an example of the method 300, disposing the first metallic via bar and the second metallic via bar and electrically connecting the first and second metallic via bars with the first and second metallic side walls comprises galvanic plating.

FIG. 4 comprises FIGS. 4_1 to 4_30 and shows schematic cross-sectional side view representations for illustrating a method for fabricating a semiconductor device package such as that shown in FIG. 1.

FIGS. 4_1 to 4_13 show the fabrication of the core layer of the semiconductor device package to be fabricated.

According to FIG. 4_1 an FR4 layer 400 comprises a first main face and a second main face, and two Cu foils 401 and 402 each one comprising a stack of two Cu sublayers, a thin seed layer and a thick release layer. Both sublayers can be easily separated from each other.

According to FIG. 4_2 each one of the Cu foils 401 and 402 are applied with their release layers onto one of the first and second main faces of the FR4 layer 400, respectively.

According to FIG. 4_3 a lithography process is conducted by applying photoresist layers 403 and 404 onto the Cu foils 401 and 402 and thereafter removing portions of and creating openings 403_1, 403_2 and 404_1, 404_2 in the photoresist layers 403 and 404 which openings reach down to the Cu foils 401 and 402. The openings 403_2 and 404_2 are each formed by a contiguous ring.

According to FIG. 4_4 the openings are filled with Cu by galvanic plating. The resulting outer Cu regions 403_3 are precursors of the first and second metallic side walls 30 and 40 of FIG. 1, whereas the inner Cu regions 403_4 and 404_4 are contiguous ring regions and can function as cavity opening rings as will be explained below.

According to FIG. 4_5 the photoresist layers 403 and 404 are removed.

According to FIG. 4_6 there are provided two polymer layers 405 and 406, in particular two FR 4 prepreg layers. The polymer layer 405 is a precursor of the polymer layer 80 of FIG. 1.

According to FIG. 4_7 the FR 4 prepreg layers 405 and 406 are laminated onto the upper Cu portions 403_3, 403_4 and lower Cu portions 404_3, 404_4, respectively.

According to FIG. 4_8 a grinding process is conducted in order to expose the outer surfaces of the Cu portions 403_3, 403_4, 404_3, and 404_4.

According to FIG. 4_9 the grinding process is finished so that the outer surfaces of the Cu portions 403_3, 403_4, 404_3, 404_4 are exposed to the outside.

According to FIG. 4_10 the FR 4 prepreg layers 405 and 406 with the incorporated Cu portions 403_3, 403_4, 404_3, 404_4 are separated from the FR 4 layer 400 by separating seed layers and release layers of the two-layer copper foils 401 and 402 from each other, respectively (see large arrows).

According to FIG. 4_11 and the following Figures only the further processing of one of the two prepreg layers, namely the prepreg layer 405, is described. According to FIG. 4_11 the FR 4 prepreg layer 405 is shown after removing the seed layer of the previous two-layer copper foil 401.

According to FIG. 4_12 a lithography process is conducted by applying photoresist layers 408 and 409 onto the upper and lower surfaces of the FR 4 prepreg layer 405 wherein inner portions including the ring-like Cu region 403_4 are left free. The photoresist layers 408 and 409 are intended to mask the outer regions of the upper and lower main faces of the layer 405.

According to FIG. 4_13 the Cu ring region 403_3 together with the region of the FR 4 prepreg layer 405 enclosed by the Cu ring 403_3 is removed by etching, thereby leaving behind a central opening 410 which is intended to accommodate a semiconductor die therein later.

According to FIG. 4_14 the photoresist layers 408 and 409 are removed.

FIGS. 4_15 to 4_21 show the placement of the semiconductor die and the subsequent embedding.

According to FIG. 4_15 a bonding tape 411 is attached to a backside surface of the FR 4 prepreg layer 405.

According to FIG. 4_16 a semiconductor die 412 is placed in the opening 410 by attaching it onto an upper surface of the bonding tape 411. The semiconductor die 412 comprises a first upper surface with a contact pad 412A disposed thereon, and a second lower surface with contact pads 412B and 412C disposed thereon. The contact pads 412A, 412B, and 412C can be a drain pad, a source pad and a gate pad of an IGBT die.

According to FIG. 4_17 a polymer layer 413 is laminated on the FR 4 prepreg layer 405 and the semiconductor die 412 wherein the polymer film 413 also flows into the opening 410 and thereby encapsulates the semiconductor die 412. The polymer film 413 is a precursor of the polymer 25 of FIG. 1.

According to FIG. 4_18 the bonding tape 411 is removed.

FIGS. 4_19 to 4_21 show the removing of a portion of the polymer layer 413 above the contact pad 412A.

According to FIG. 4_19 an upper part of this portion is removed by laser drilling.

According to FIG. 4_20 removing the upper part is completed.

According to FIG. 4_21 the rest of the portion of the polymer layer 413 is removed by plasma etching. As a result only a portion of the polymer layer 413 around the semiconductor die 412 is remaining.

FIGS. 4_22 to 4_35 show the final processing of the PCB and the semiconductor device package.

According to FIG. 4_22 a seed layer 414 is deposited onto both the upper and lower surfaces of the structure. The seed layer 414 can be deposited by sputtering and the material can be Cu. A barrier layer of Ti or TiW can be sputtered first before sputtering the Cu.

According to FIG. 4_23 photoresist layers 415 and 416 are deposited onto the upper and lower surfaces of the structure, respectively, in order to mask particular portions of the upper and lower surfaces regarding the subsequent plating process.

According to FIG. 4_24 Cu layers 417 and 418 are galvanically plated onto the upper and lower unmasked surfaces. A first Cu layer 417 covers the drain pad 412A and electrically connects it with the left side metallic side wall 403_3, and a second Cu layer 418 covers the source pad 412B and electrically connects it with the right side metallic side wall 403_3. The second Cu layer 418 also covers the gate pad 412C.

According to FIG. 4_25 additional photoresist layers 419 and 420 are deposited onto the previous photoresist layers 415 and 416 in order to prepare for a subsequent further plating process.

According to FIG. 4_26 a further galvanic Cu plating is conducted to create an upper Cu layer 421 and a lower Cu layer 422. The further Cu layers 421 and 422 are only deposited onto the previous Cu layers connecting the drain and source pads to the respective side walls. The gate pad is not covered by the further Cu layer 422 and is instead routed to a different location. The lithography and plating process is conducted such that a thickness of the Cu layers on the drain pad 412A and the source pad 412B is at least 100 μm.

According to FIG. 4_27 the photoresist layers 419 and 420 are removed.

According to FIG. 4_28 polymer layers 423 and 424 are laminated onto the upper and lower surfaces of the structure. The polymer layers 423 and 424 are precursors of the polymer layer 70 as shown in FIG. 1.

According to FIG. 4_29 the polymer layers 423 and 424 are thinned so that upper surfaces of the connecting portions of the Cu layers are exposed to the outside. The thinning can be performed by grinding, plasma etching etc.

According to FIG. 4_30 through-holes 425 and 426 are formed into the device. As can be seen in the upper part of FIG. 4_30, the through-holes 425 and 426 reach from the upper main face down to the lower main face of the device. As can be seen in the lower part of FIG. 4_30, the through-holes 425 and 426 have an elongate form and a left-side through-hole 425 is located along an interface between the left-side side wall 403_3 and the adjacent FR 4 layer 405 and polymer layers 423 and 424, and likewise a right-side through-hole 426 is located along an interface between the right-side side wall 403_3 and the adjacent FR 4 layer 405 and polymer layers 423 and 424.

According to FIG. 4_31 Cu layers 427 and 428 are formed on the upper and lower main faces of the structure. The Cu layers 427 and 428 are formed by the steps of sputtering or plating a seed layer, lithography, Cu plating, photoresist stripping, and etching.

According to FIG. 4_32 solder resist layers 429 and 430 are deposited on the upper and lower main faces of the structure. The solder resist layers 429 and 430 are formed into the recesses of the Cu layers 427 and 428 and in part on adjacent portions of the Cu layers. Also a surface finishing is performed on the Cu side walls.

According to FIG. 4_33 a dicing of the structure is performed along dicing streets 431 as shown in the lower part in order to obtain a final semiconductor device as shown in the upper part. One feature of the final semiconductor device is that the outer lateral faces of the sidewalls are exposed to the outside.

Figure 5:
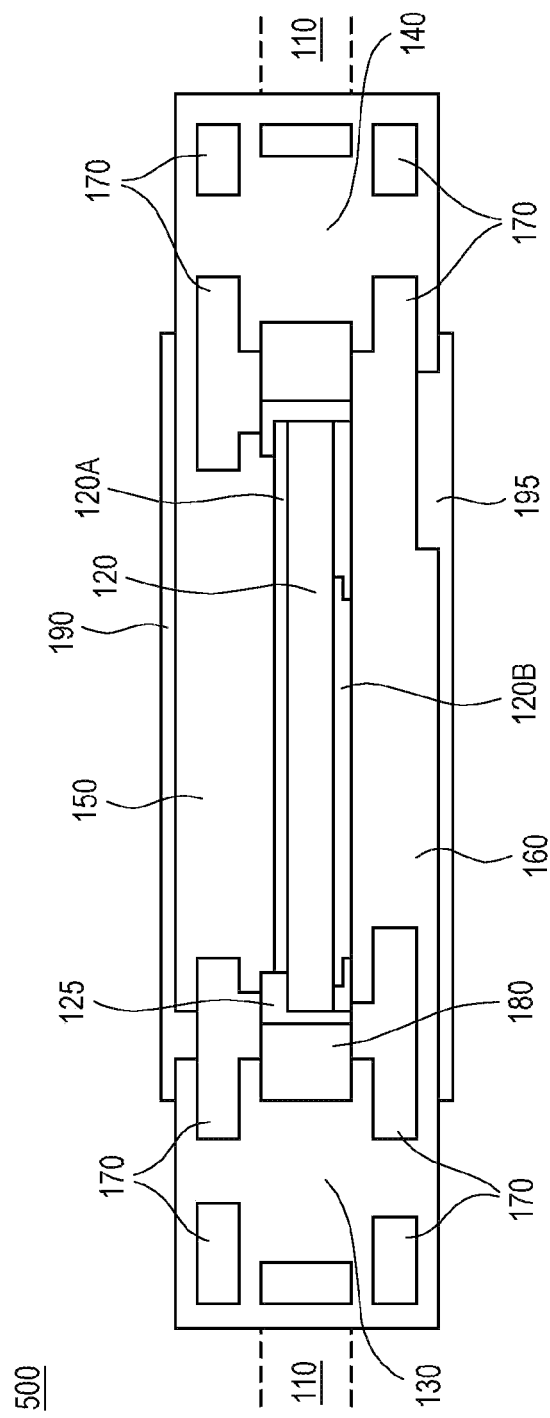
FIG. 5 shows a schematic cross-sectional side view representation of a semiconductor device package according to an example, in which as compared to FIG. 1 the core layer is formed differently.

FIG. 5 shows a schematic cross-sectional side view representation of a semiconductor device package according to an example, in which as compared to FIG. 1 the core layer is formed differently.

More specifically, the semiconductor device package 500 of FIG. 5 comprises a printed circuit board 110, a semiconductor die 120 comprising a first contact pad 120A and a second contact pad 120B (drain and source pads, the gate pad is not visible here), a polymer layer 125 embedding the semiconductor die 120, a first metallic sidewall 130, a second metallic side wall 40, a first via bar 150, a second via bar 160, a polymer layer 170, a polymer layer 180, and solder resist layers 190 and 195. All these elements have similar properties and are fabricated in a similar way as the respective comparable elements of the semiconductor device package 100 of FIG. 1.

One difference to the semiconductor device package 100 of FIG. 1 is the structure of the polymer layers 170 and 180. In the semiconductor device package 500 the polymer layers 170 and 180 both comprise portions at the outer left end and the outer right end of the device which were not present in the semiconductor device package 100 of FIG. 1.

One further difference to the semiconductor device package 100 of FIG. 1 is that the first contact 120A of the semiconductor device 120 is electrically connected with the second metallic side wall 140, and the second contact pad 120B of the semiconductor device 120 is electrically connected with the first metallic side wall 130.

Example 1 is a semiconductor device package, comprising a printed circuit board comprising a first central area, a second lateral area, and a third lateral area, a semiconductor die comprising a first main face and a second main face opposite to the first main face, a first contact pad disposed on the first main face and a second contact pad disposed on the second main face, the semiconductor die being disposed in the first central area of the printed circuit board, a first metallic side wall of the semiconductor device package disposed in the second lateral area of the printed circuit board, a second metallic side wall of the semiconductor device package disposed in the third lateral area of the printed circuit board, wherein at least one of the first metallic side wall and the second metallic side wall is electrically connected with one of the first contact pad or the second contact pad (20B) of the semiconductor die.

Example 2 is a semiconductor device package according to Example 1, wherein one of the first metallic side wall and the second metallic side wall is electrically connected to the first contact pad of the semiconductor die, and the other one of the first metallic side wall the and second metallic side wall is electrically connected to the second contact pad of the semiconductor die.

Example 3 is a semiconductor device package according to Example 2, further comprising a first metallic via bar connected between the first contact pad of the semiconductor die and the first metallic side wall, and a second metallic via bar connected between the second contact pad of the semiconductor die and the second metallic side wall.

Example 4 is a semiconductor device package according to any one of the preceding Examples, further comprising a first upper main face of the semiconductor device package and a second lower main face of the semiconductor device package, wherein at least one of the first metallic side wall and the second metallic side wall is exposed at the first upper main face and/or at the second lower main face of the semiconductor device package.

Example 5 is a semiconductor device package according to any one of Examples 2 to 4, wherein the first metallic side wall and the second metallic side wall are exposed at the first upper main face and/or at the second lower main face of the semiconductor device package.

Example 6 is a semiconductor device package according to any one of the preceding Examples, further comprising an isolation distance between the second contact pad and the one of the metallic side walls which is connected with the first contact pad, is in a range between 100 μm and 300 μm, wherein the lower bound of the range can also be 110 μm, 120 μm, 130 μm, 140 μm, or 150 μm, and the upper bound of the range can also be 290 μm, 280 μm, 270 μm, 260 μm, or 250 μm.

Example 7 is a semiconductor device package according to any one of the preceding Examples, further comprising a laminate layer disposed on the printed circuit board, wherein the first metallic side wall, the second metallic side wall, the first metallic via bar, and the second metallic via bar are disposed within areas of the laminate layer.

Example 8 is a method for fabricating a semiconductor device package, the method comprising providing a printed circuit board comprising a first central area, a second lateral area, and a third lateral area, wherein a semiconductor die comprising contact pads is disposed in the first central opening, a first metallic side wall is disposed in the second lateral area, and a second metallic side wall is disposed in the third lateral area, electrically connecting at least one of the first and second metallic side walls with one of the contact pads of the semiconductor die, and finishing the semiconductor device package so that the first and second metallic side walls are exposed to the outside and defining a respective side wall of the semiconductor device package.

Example 9 is a method according to Example 8, further comprising electrically connecting one of the first metallic side wall and the second metallic side wall to the first contact pad of the semiconductor die, and electrically connecting the other one of the first metallic side wall and the second metallic side wall to the second contact pad of the semiconductor die.

Example 10 is a method according to Example 9, wherein electrically connecting is conducted such that both the first metallic side wall and the second metallic side wall are exposed at at least one of a first upper main face and a second lower main face of the semiconductor device package.

Example 11 is a method according to any one of Examples 8 to 10, further comprising after electrically connecting, disposing an isolation layer over at least the semiconductor die.

Example 12 is a method according to any one of Examples 8 to 11, wherein electrically connecting comprises galvanic plating.

Example 13 is a semiconductor device package, comprising a printed circuit board comprising a first central area, a semiconductor die comprising a first main face and a second main face opposite to the first main face, a first contact pad disposed on the first main face and a second contact pad disposed on the second main face, the semiconductor die being disposed in the first area of the printed circuit board, a first metallic via bar disposed on the first contact pad of the semiconductor die, the first metallic via bar comprising a thickness of at least 100 µm, and a second metallic via bar disposed on the second contact pad of the semiconductor die, the second metallic via bar comprising a thickness of at least 100 µm.

Example 14 is a semiconductor device package according to Example 13, wherein a thickness of each one of the first metallic via bar and the second metallic via bar is in a range from 100 µm to 300 µm, wherein the lower bound of the range can also be 110 µm, 120 µm, 130 µm, 140 µm, or 150 µm, and the upper bound of the range can also be 290 µm, 280 µm, 270 µm, 260 µm, or 250 µm.

Example 15 is a semiconductor device package according to Example 13 or 14, further comprising the printed circuit board further comprising a second lateral area, and a third lateral area, a first metallic side wall of the semiconductor device package disposed in the second lateral area of the printed circuit board, a second metallic side wall of the semiconductor device package disposed in the third lateral area of the printed circuit board, wherein at least one of the first metallic side wall and the second metallic side wall is electrically connected with one of the first die pad or the second die pad of the semiconductor die.

Example 16 is a semiconductor device package according to Example 15, wherein the first metallic via bar is connected between the first contact pad of the semiconductor die and the first metallic side wall, and the second metallic via bar is connected between the second contact pad of the semiconductor die and the second metallic side wall.

Example 17 is a semiconductor device package according to any one of Examples 13 to 16, further comprising a laminate layer disposed on the printed circuit board, wherein the first metallic side wall, the second metallic side wall, the first metallic via bar, and the second metallic via bar are disposed within areas of the laminate layer.

Example 18 is a method for fabricating a semiconductor device package, the method comprising providing a printed circuit board comprising a first central opening, wherein a semiconductor die is disposed in the first central opening, the semiconductor die comprising a first main face and a second main face opposite to the first main face and a first contact pad disposed on the first main face and a second contact pad disposed on the second main face, disposing a first metallic via bar on the first contact pad of the semiconductor die, the first metallic via bar comprising a thickness of at least 100 µm, and disposing a second metallic via bar on the second contact pad of the semiconductor die, the second metallic via bar comprising a thickness of at least 100 µm.

Example 19 is a method according to Example 18, further comprising the printed circuit board further comprises a second lateral opening, and a third lateral opening, wherein a first metallic side wall is disposed in the second lateral opening of the printed circuit board, and a second metallic side wall is disposed in the third lateral opening of the printed circuit board, electrically connecting the first metallic via bar with the first metallic side wall, and electrically connecting the second metallic via bar with the second metallic side wall.

Example 20 is a method according to Example 19, wherein disposing the first metallic via bar and the second metallic via bar and electrically connecting the first and second metallic via bars with the first and second metallic side walls comprises galvanic plating.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

The invention claimed is:

1. A semiconductor device package, comprising:
   a printed circuit board comprising a first central area, a second lateral area, and a third lateral area;
   a semiconductor die comprising a first main face and a second main face opposite to the first main face, a first contact pad disposed on the first main face and a second contact pad disposed on the second main face, the semiconductor die being disposed in the first central area of the printed circuit board;
   a first metallic side wall of the semiconductor device package disposed in the second lateral area of the printed circuit board;
   a second metallic side wall of the semiconductor device package disposed in the third lateral area of the printed circuit board;
   wherein at least one of the first metallic side wall and the second metallic side wall is electrically connected with one of the first contact pad or the second contact pad of the semiconductor die.

2. The semiconductor device package according to claim 1, wherein one of the first metallic side wall and the second metallic side wall is electrically connected to the first contact pad of the semiconductor die, and the other one of the first metallic side wall the and the second metallic side wall is electrically connected to the second contact pad of the semiconductor die.

3. The semiconductor device package according to claim 2, further comprising:
a first metallic via bar connected between the first contact pad of the semiconductor die and the first metallic side wall, and
a second metallic via bar connected between the second contact pad of the semiconductor die and the second metallic side wall.

4. The semiconductor device package according to claim 1, further comprising:
a first upper main face of the semiconductor device package and a second lower main face of the semiconductor device package,
wherein at least one of the first metallic side wall and the second metallic side wall is exposed at the first upper main face and/or at the second lower main face of the semiconductor device package.

5. The semiconductor device package according to claim 2, wherein the first metallic side wall and the second metallic side wall are exposed at the first upper main face and/or at the second lower main face of the semiconductor device package.

6. The semiconductor device package according to claim 1, further comprising an isolation distance between the second contact pad and the first metallic side wall or the second metallic side wall electrically connected with the first contact pad, is in a range between 100 µm and 300 µm.

7. The semiconductor device package according to claim 1, further comprising
a laminate layer disposed on the printed circuit board, wherein
the first metallic side wall, the second metallic side wall, the first metallic via bar, and the second metallic via bar are disposed within areas of the laminate layer.

8. A semiconductor device package, comprising:
a printed circuit board comprising a first central area;
a semiconductor die comprising a first main face and a second main face opposite to the first main face, a first contact pad disposed on the first main face and a second contact pad disposed on the second main face, the semiconductor die being disposed in the first central area of the printed circuit board;
a first metallic via bar disposed on the first contact pad of the semiconductor die, the first metallic via bar comprising a thickness of at least 100 µm;
a second metallic via bar disposed on the second contact pad of the semiconductor die, the second metallic via bar comprising a thickness of at least 100 µm; and
at least one metallic side wall disposed in at least one area of the printed circuit board,
wherein the at least one metallic side wall is exposed at the first main face and/or at the second main face of the semiconductor device package.

9. The semiconductor device package according to claim 8, wherein a thickness of each one of the first metallic via bar and the second metallic via bar is in a range from 100 µm to 300 µm.

10. The semiconductor device package according to claim 8, further comprising:
the printed circuit board further comprising a second lateral area, and a third lateral area,
wherein a first metallic side wall of the at least one metallic side wall is disposed in the second lateral area of the printed circuit board,
wherein a second metallic side wall of the at least one metallic side wall is disposed in the third lateral area of the printed circuit board, and
wherein at least one of the first metallic side wall and the second metallic side wall is electrically connected with one of the first die pad or the second die pad of the semiconductor die.

11. The semiconductor device package according to claim 10, wherein the first metallic via bar is connected between the first contact pad of the semiconductor die and the first metallic side wall, and the second metallic via bar is connected between the second contact pad of the semiconductor die and the second metallic side wall.

12. The semiconductor device package according to claim 8, further comprising:
a laminate layer disposed on the printed circuit board,
wherein a first metallic side wall of the at least one metallic side wall, a second metallic side wall of the at least one metallic side wall, the first metallic via bar, and the second metallic via bar are disposed within areas of the laminate layer.

* * * * *